US012719025B2

(12) United States Patent
Wang et al.

(10) Patent No.: US 12,719,025 B2
(45) Date of Patent: Aug. 25, 2026

(54) METHODS FOR SEMICONDUCTOR PROCESS CHAMBER

(71) Applicant: Tokyo Electron Limited, Tokyo (JP)

(72) Inventors: Qi Wang, Albany, NY (US); Hamed Hajibabaeinajafabadi, Albany, NY (US); Sergey Voronin, Albany, NY (US); Akiteru Ko, Albany, NY (US)

(73) Assignee: Tokyo Electron Limited, Tokyo (JP)

( * ) Notice: Subject to any disclaimer, the term of this patent is extended or adjusted under 35 U.S.C. 154(b) by 618 days.

(21) Appl. No.: 18/163,934

(22) Filed: Feb. 3, 2023

(65) Prior Publication Data

US 2024/0266149 A1 Aug. 8, 2024

(51) Int. Cl.

*H01J 37/32* (2006.01)
*H10P 50/00* (2026.01)
*H10P 50/24* (2026.01)
*H10P 72/00* (2026.01)

(52) U.S. Cl.

CPC .. *H01J 37/32477* (2013.01); *H01J 37/32862* (2013.01); *H10P 50/242* (2026.01); *H10P 50/692* (2026.01); *H01J 2237/3341* (2013.01); *H10P 72/0604* (2026.01)

(58) Field of Classification Search

None
See application file for complete search history.

(56) References Cited

U.S. PATENT DOCUMENTS

| | | | | |
|---|---|---|---|---|
| 10,128,133 | B1 * | 11/2018 | Haghofer | H01J 37/32862 |
| 2004/0231800 | A1 * | 11/2004 | Singh | H01J 37/321 156/345.48 |
| 2005/0260354 | A1 | 11/2005 | Singh et al. | |
| 2018/0240667 | A1 | 8/2018 | Yu et al. | |
| 2021/0340670 | A1 | 11/2021 | Singhal et al. | |
| 2022/0275504 | A1 | 9/2022 | Shanbhag et al. | |

FOREIGN PATENT DOCUMENTS

| | | | | |
|---|---|---|---|---|
| KR | 20070026608 | A | 3/2007 | |
| KR | 20210062712 | A | 5/2021 | |
| KR | 20220078723 | A | 6/2022 | |
| WO | 2018152115 | A1 | 8/2018 | |
| WO | WO-2020264571 | A1 * | 12/2020 | H01J 37/32862 |

OTHER PUBLICATIONS

International Search Report and Written Opinion, PCT/US2024/010787, mailed May 13, 2024, Total pp. 11.

* cited by examiner

*Primary Examiner* — Stephanie P Duclair
(74) *Attorney, Agent, or Firm* — Slater Matsil, LLP

(57) ABSTRACT

A method for performing an etch process includes forming a first protective layer over chamber walls of a semiconductor process chamber and performing a first etch process on an exposed major surface of a first substrate loaded into the semiconductor process chamber. The exposed major surface includes a first metal oxide resist layer. After performing the first etch process on the first substrate, the first protective layer is removed from the chamber walls with a cleaning process.

19 Claims, 17 Drawing Sheets

METHODS FOR SEMICONDUCTOR PROCESS CHAMBER

TECHNICAL FIELD

The present invention relates generally to semiconductor manufacturing, and, in particular embodiments, to methods for semiconductor process chambers.

BACKGROUND

Photolithography is commonly used to pattern thin films during semiconductor processing, where photons are emitted from a light source onto a photosensitive photoresist to initiate a chemical reaction in the photoresist. Thereafter, the photoresist is developed and exposed or unexposed portions of the photoresist are removed to form a pattern or a mask.

There is continuous effort in the sphere of semiconductor manufacturing to increase device density in order to improve speed and performance while reducing costs. Scaling of semiconductor devices has enabled significant technological advances, including advanced lithographic techniques such as immersion lithography. Extreme Ultraviolet (EUV) radiation can be used for providing improved pattern resolution in advanced integrated circuits where reduction in feature sizes is required. Common EUV photoresists are polymer-based chemically amplified resists (CARs) that are deposited on substrates using liquid-based spin-on techniques that consume a significant amount of complex precursors. Recently, inorganic-based resists have received interest as they may be patterned using EUV radiation and can offer the high etch resistance and etch selectivity needed for semiconductor manufacturing. However, processing and development of inorganic-based resists presents new challenges.

Existing technology for development of photoresists used in semiconductor manufacturing largely relies on wet development (e.g., development using a solvent). Although wet development offers a high throughput approach that may result in complete removal of negative-tuned (or positive-tuned) areas of developed photoresists, one disadvantage with wet development technology is a loss of structural integrity resulting from detrimental capillary forces produced by solvent removal. Dry development processes may be used to avoid structural integrity loss occurring from wet development. However, dry development processes may present new challenges.

SUMMARY

In accordance with an embodiment, a method for performing an etch process includes: forming a first protective layer over chamber walls of a semiconductor process chamber; performing a first etch process on an exposed major surface of a first substrate loaded into the semiconductor process chamber, the exposed major surface including a first metal oxide resist layer; and after performing the first etch process on the first substrate, removing the first protective layer from the chamber walls with a cleaning process.

In accordance with another embodiment, a method for performing an etch process includes: loading a first wafer into a process chamber; depositing a protective coating on chamber walls of the process chamber and on the first wafer while monitoring a thickness of the protective coating on the first wafer; removing the first wafer from the process chamber; loading a second wafer into the process chamber, a metal oxide resist being on the second wafer; performing a development process on the second wafer; removing the second wafer from the process chamber; and performing a cleaning process in the process chamber, the cleaning process removing the protective coating.

In accordance with yet another embodiment, a method for performing an etch process includes: flowing a fluorogas into a process chamber; igniting a first plasma including the fluorogas, the first plasma depositing a protective layer over inner surfaces of the process chamber; loading a process wafer with a metal oxide resist into the process chamber; etching the metal oxide resist with HBr gas in the process chamber, where residues from the etching of the metal oxide resist are deposited on the protective layer; removing the process wafer from the process chamber; flowing an oxidizing gas into the process chamber; and igniting a second plasma including the oxidizing gas, the second plasma removing the protective layer.

It is to be understood that both the foregoing general description and the following detailed description are exemplary and explanatory only and are not restrictive of the disclosure, as claimed.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the embodiments and are not necessarily drawn to scale. The edges of features drawn in the figures do not necessarily indicate the termination of the extent of the feature.

DETAILED DESCRIPTION OF ILLUSTRATIVE EMBODIMENTS

The making and using of various embodiments are discussed in detail below. It should be appreciated, however, that the various embodiments described herein are applicable in a wide variety of specific contexts. The specific embodiments discussed are merely illustrative of specific ways to make and use various embodiments, and should not be construed in a limited scope.

According to one or more embodiments of the present disclosure, this application relates to methods for semiconductor process chambers, such as for dry development of metal oxide resists. Current methods for dry development of metal oxide resists for dry etches may be based on chemical reactions of the material with a gaseous precursor without its additional excitation (in other words, without ionization of the gaseous precursor). These dry development solutions may also be referred to as plasma-less processes. However, reaction by-products of developed and etched metal oxide resists may remain in the process chamber, leading to different pre-process and post-process chamber conditions. For example, solid by-products of etch reactions may remain on process chamber walls and may be difficult or time-consuming to remove completely. Effective removal of the reaction by-products may be useful to maintain process stability and basic functionality of the apparatuses used (e.g., process chambers).

Embodiments of the disclosure are described in the context of the accompanying drawings. Embodiments of example semiconductor processing systems will be described using FIGS. 1A and 1B. An embodiment of a method for forming a protective layer on chamber walls of a process chamber will be described using FIGS. 2 through 5. An embodiment of an etch process performed in a process chamber with a protective layer will be described using FIGS. 6 through 8. An embodiment of a cleaning process for removing a protective layer from chamber walls of a process chamber will be described using FIGS. 9 through 11. Experimental results from chamber health monitoring will be described using FIG. 12. Experimental results for X-ray photoemission spectroscopy (XPS) of substrates with fluorocarbon layers will be described using FIGS. 13 and 14. Experimental results for X-ray photoemission spectroscopy (XPS) of substrates after protective layers are removed will be described using FIGS. 15 and 16. Embodiments of methods for performing etch processes will be described using FIGS. 17 through 21.

Figure 1A:
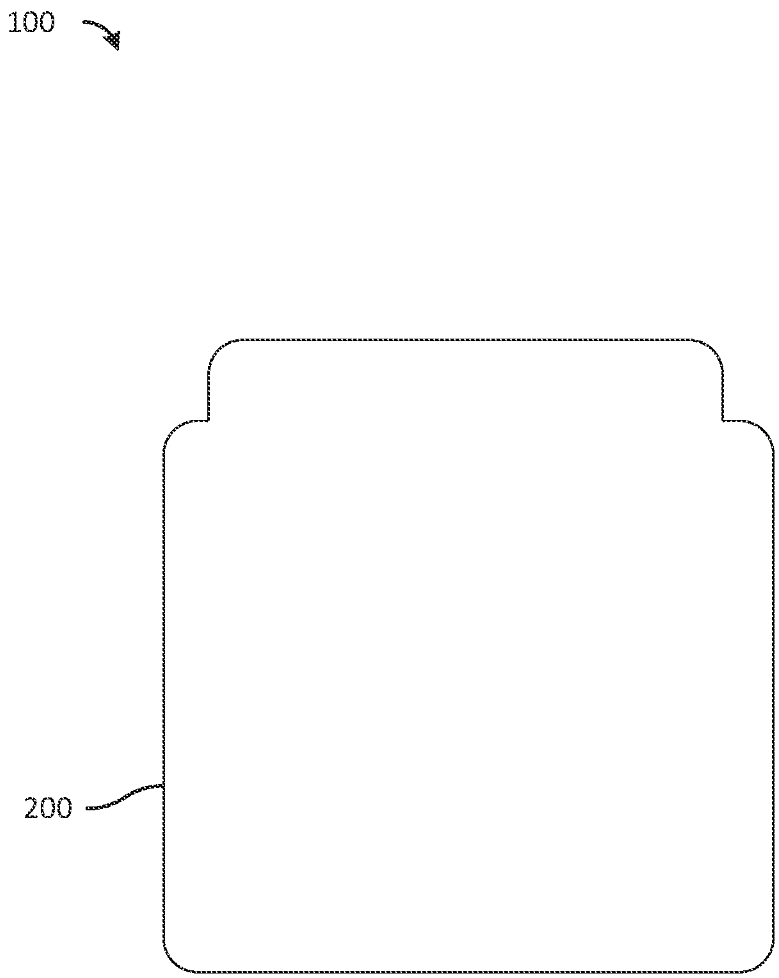
FIGS. 1A and 1B show cross-sectional views of example semiconductor processing systems, in accordance with some embodiments.

FIG. 1A illustrates a cross-sectional view of an example semiconductor processing system 100, in accordance with some embodiments. The semiconductor processing system 100 includes a process chamber 200. In various embodiments, the process chamber 200 comprises stainless steel walls. However, any suitable materials may be used for the walls of the process chamber 200, such as aluminum, other metals, ceramics, or a combination thereof. The semiconductor processing system 100 may be any system suitable for performing a semiconductor etch process, such as a reactive ion etch (RIE). The semiconductor processing system 100 may include a method for supplying plasma to the process chamber 200 in order to form a protective layer on chamber walls of the process chamber 200 (see below, FIGS. 2-5).

Figure 1B:
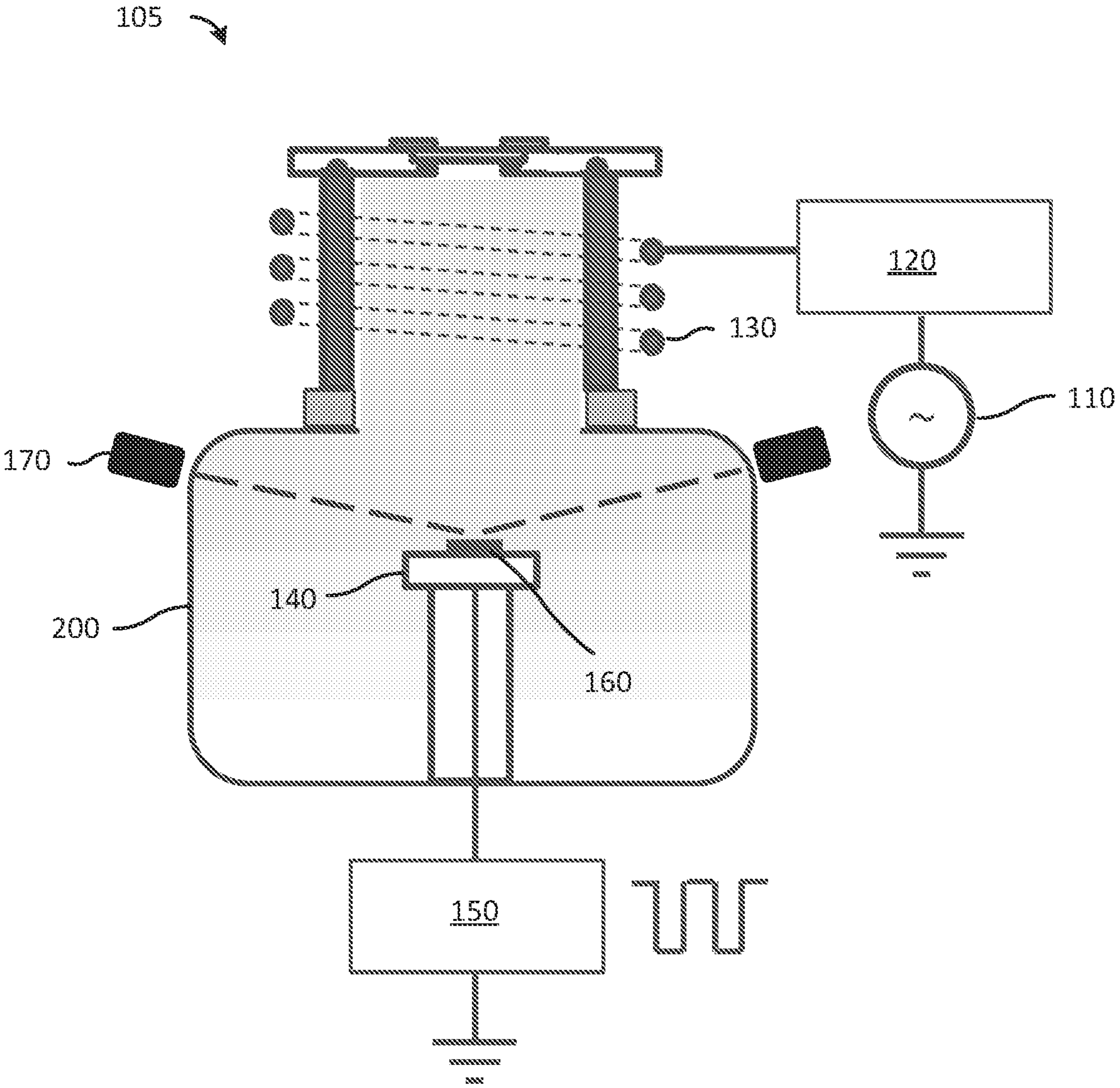

FIG. 1B illustrates a cross-sectional view of an example semiconductor processing system 105 that includes a process chamber 200 and an inductively coupled plasma (ICP) system. However, the semiconductor processing system 105 may include any suitable system for supplying plasma to the process chamber 200, such as a capacitively coupled plasma (CCP) system, a remote plasma system, or the like. Any suitable apparatus or method for supplying plasma to or generating plasma within the process chamber 200 is within the scope of the disclosed embodiments.

The ICP system includes a RF generator 110, which supplies power through a matching circuit 120 to an inductive coil 130. The RF generator 110 produces an RF waveform or signal supplied to the inductive coil 130. The RF generator 110 may be a waveform (e.g., a sinusoidal waveform) generator, an analog RF generator, or the like. In some embodiments, the RF generator 110 has broadband capability. However, any suitable RF generator 110 may be used, such as a RF generator without broadband capability.

The matching circuit 120 (also referred to as a matcher or an impedance matching network) is coupled between the RF generator 110 and the inductive coil 130. As forward power propagates from the RF generator 110 to the inductive coil 130, some reflected power may be reflected back due to impedance mismatch between the inductive coil 130 and the RF generator 110. The matching circuit 120 is used to reduce reflected power by transforming the impedance load into the matching circuit 120, which is coupled to the inductive coil 130, to a same impedance as the RF generator 110 and transmission lines between the RF generator 110 and the inductive coil 130. This increases the efficiency of supplying power to the inductive coil 130.

Gases such as precursors for a plasma may be flowed into the process chamber 200 through a top portion surrounded by the inductive coil 130. Power may be coupled from the RF generator 110 to the inductive coil 130 in order to excite the gas into a plasma and generate a high density plasma for forming a protective layer on chamber walls of the process chamber 200. However, any suitable method and apparatus may be used to supply plasma to the process chamber 200.

The process chamber 200 includes a chuck 140 (e.g., an electrostatic chuck) for securing test substrates or substrates to be processed. A test substrate 160 (also referred to as a test wafer) may be mounted on the chuck 140. The test substrate 160 may be any suitable substrate, such as a silicon wafer. The test substrate 160 may have a silicon dioxide ($SiO_2$) film over it for chamber health monitoring. In some embodiments, the chuck 140 is coupled to a DC pulse bias generator 150 in order to allow for precise ion energy control by negative DC pulsing. In some embodiments, the negative DC pulsing may be run with a suitable pattern (e.g., 1 μs on and 2 μs off per cycle) to control silicon dioxide ($SiO_2$) film physical sputtering by $Ar^+$ ions. This may be used as a health monitor for the chamber wall of the process chamber 200. As an example, the $SiO_2$ film physical sputtering by $Ar^+$ ions may be performed at a pressure of 10 mT, using a plasma power (measured at the power source) of 200 W, with a sputtering gas that consists essentially of argon.

Contamination of the chamber wall by, e.g., tin may affect the sputtering rate of $SiO_2$ film on the test substrate 160 as a function of chamber health. For example, the sputtering rate of $SiO_2$ in a test chamber was observed to drastically drop after a metal oxide resist etch process had been performed in the test chamber. This may have been caused by some form of Sn-related etch byproducts that remained in the test chamber.

The test substrate 160 may be kept in the process chamber 200 during formation of the protective layer so that the protective layer is also formed on the test substrate 160. In this way, thickness of the protective layer may be measured in real time as it is formed. One or more sensor(s) 170 may be arranged around the process chamber 200 to perform measurements of the protective layer formed on the test substrate 160. The one or more sensor(s) 170 may be ellipsometers, quartz crystal microbalances (QCMs), or the like. In some embodiments in which the sensor 170 is an ellipsometer, the sensor 170 includes two components: a light source with associated optics (e.g., a polarizer) and an analyzer/detector with associated optics. In other embodiments, more than one sensor 170 is used and aligned at different locations around the process chamber 200. In still other embodiments, the sensor 170 is moveable with respect to the process chamber 200. Although one sensor 170 is illustrated in FIG. 1B, any suitable number of sensors may be used, such as one to ten sensors 170.

In some embodiments, the one or more sensor(s) 170 is a QCM that is mounted to a sidewall of the process chamber 200 to monitor the deposition rate of the protective layer. The test substrate 160 may be omitted and a waferless coating process may be performed, with the chuck 140 also being coated with the protective layer.

In some embodiments, the one or more sensor(s) 170 monitor thickness of a protective layer formed on the test substrate 160 in real time (e.g., with in situ ellipsometry) in order to provide feedback on the expected thickness of the protective layer formed on chamber walls of the process chamber 200. The feedback may be used to stop the process of forming the protective layer (see below, FIG. 5) when it reaches a desired thickness. In other embodiments, the test substrate 160 is not included and the film deposition rate is not monitored in real time during the formation of the protective layer.

FIGS. 2 through 11 illustrate a method of forming a protective layer (also referred to as a protective layer coating or a protective coating) on chamber walls of a process chamber in order to remove by-products from a subsequent semiconductor process performed in the process chamber. FIGS. 2 through 5 illustrate the formation of a protective layer on the chamber walls of the process chamber.

Figure 2:
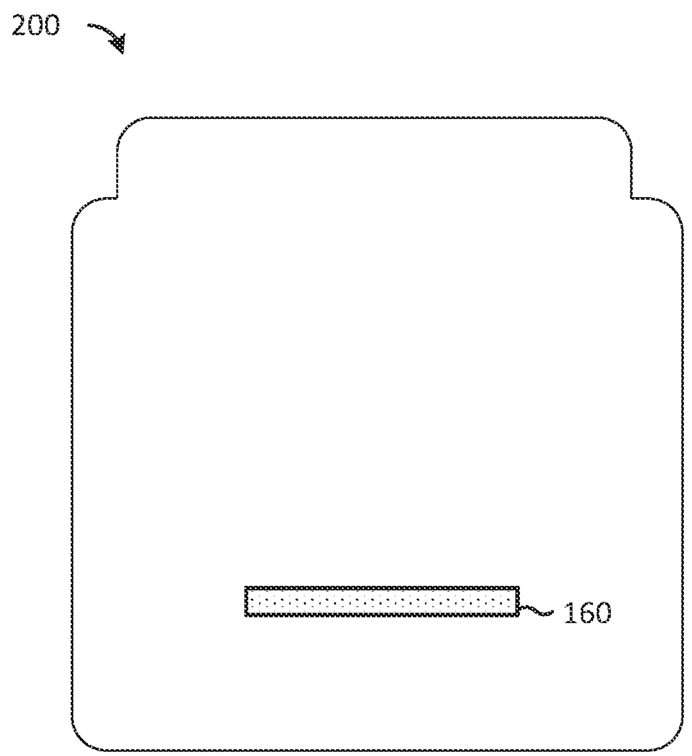
FIGS. 2 through 5 show cross-sectional views of a protective layer being formed on the chamber walls of a process chamber, in accordance with some embodiments.

FIG. 2 illustrates a cross-sectional view of a process chamber 200, which may be similar to the process chamber 200 described above with respect to FIGS. 1A and 1B, and the details are not repeated herein. In some embodiments, the process chamber 200 includes a chuck (not illustrated in FIG. 2; see above, FIG. 1B, for description of a chuck 140) for securing a test substrate 160 in the process chamber 200. In some embodiments, the test substrate 160 is loaded into the process chamber 200 in order to monitor the thickness of the subsequently formed protective layer (see below, FIGS. 4 and 5). In other embodiments, the loading of the test substrate 160 into the process chamber 200 is omitted.

Figure 3:
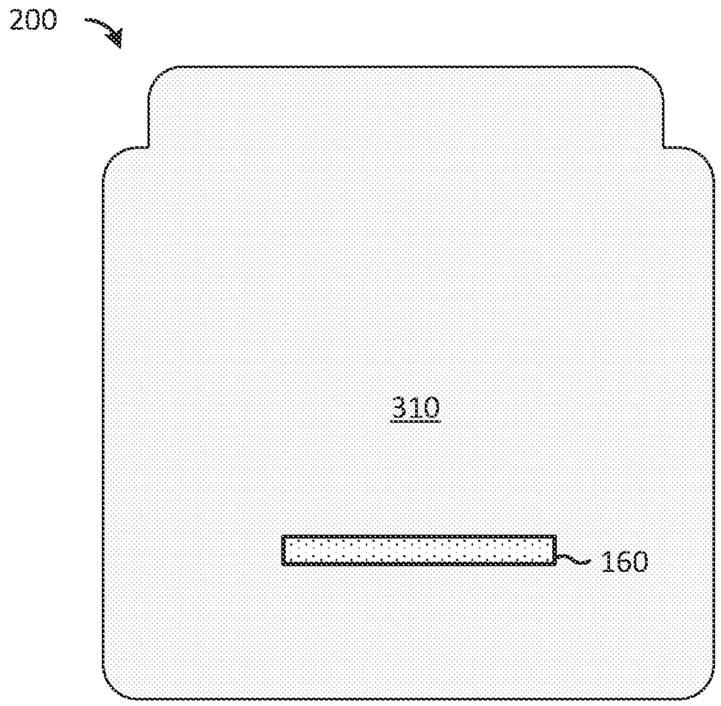

In FIG. 3, the process chamber 200 is filled with a precursor 310, which will be subsequently excited to plasma and used to form a protective layer on the chamber walls of the process chamber (see below, FIGS. 4 and 5). In some embodiments, the precursor 310 comprises a fluorogas such as $C_4F_8$, another fluorocarbon such as $CF_4$, $C_2F_6$, $C_3F_6$, a hydrofluorocarbon gas such as $CHF_3$, $CH_3F$, $CH_2F_2$, the like, or a combination thereof. The precursor 310 may also comprise a noble gas such as argon, neon, helium, xenon, the like, or a combination thereof. However, any suitable gas(es) may be used for the precursor 310.

Figure 4:
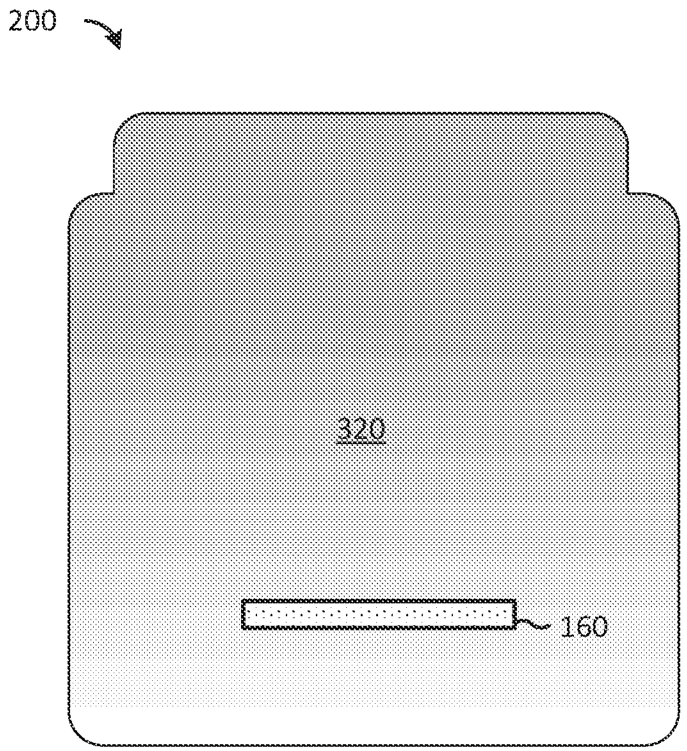

Next, in FIG. 4, a first plasma 320 is generated in the process chamber 200 by the excitation of the precursor 310 in order to deposit a protective layer on chamber walls of the process chamber 200. In some embodiments, the protective layer is deposited on inner surfaces of the process chamber 200. The first plasma 320 may be lit (in other words, ignited) by an ICP system (see above, FIG. 1B), a CCP system, or the like. In some embodiments, the first plasma 320 is ignited externally and supplied to the process chamber 200 by a remote plasma system.

In some embodiments, the first plasma 320 comprises argon and $C_4F_8$ at a volume ratio in a range of 1:99, such as 15:40. The first plasma 320 may be generated at a pressure in a range of 5 mT to 2000 mT, such as 50 mT, and the first plasma 320 may be generated using a power (as measured at the power supply) in a range of 2 W to 2000 W, such as 20 W. The first plasma 320 may be generated for a duration in a range of 1 minute to 30 minutes, such as 15 minutes, to deposit material of a desired thickness on chamber walls of the process chamber 200 and form a protective layer 330 (see below, FIG. 5).

In some embodiments, the temperature of the process chamber 200 is held in a range of 20° C. to 200° C. during the deposition process. The temperature of the chamber wall of the process chamber 200 may be controlled to control the deposition rate of the protective layer. As an example, the process chamber 200 may be controlled to have a temperature of 80° C. during the deposition process to achieve a deposition rate of 1-100 nm/min. The deposition rate should be reasonable to obtain a reasonable throughput, and the deposition rate dependency on temperature may depend on the reaction mechanism.

Figure 5:
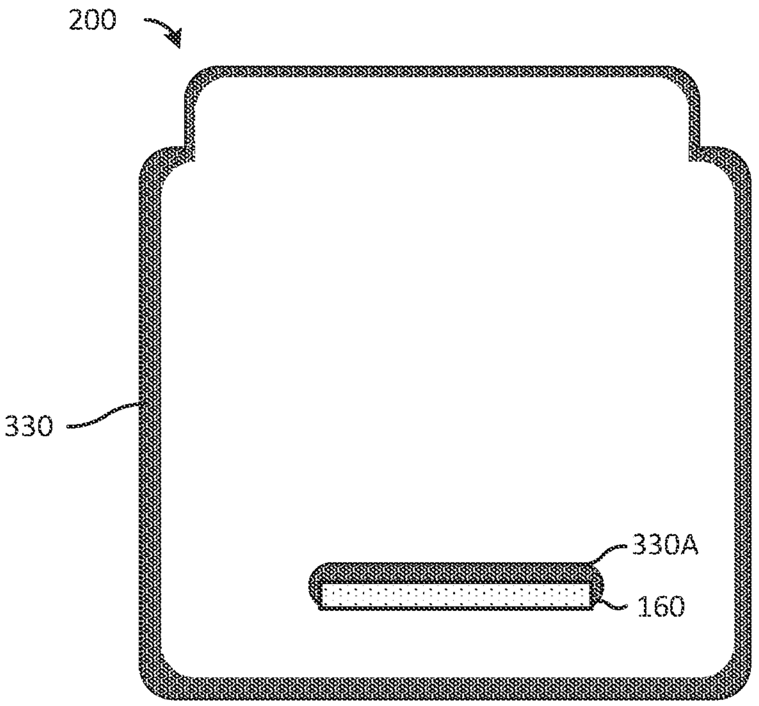

FIG. 5 illustrates a protective layer 330 deposited on chamber walls of the process chamber 200. The protective layer 330 may also be referred to as a protective coating, a protective layer coating, or a pre-coating. The protective layer 330 protects the chamber walls of the process chamber 200 from contamination by reaction by-products (e.g., metals from metal oxide resists such as tin) that may be difficult or time-consuming to remove. In some embodiments, the protective layer comprises fluorocarbon chemistry, which may be advantageous for providing good protection for chamber walls of the process chamber 200.

In some embodiments, the thickness of the protective layer 330 is measured in real time (e.g., by sensors 170; see above, FIG. 1). For example, when the test substrate 160 is present, the thickness of the portion 330A may be monitored in real time to provide feedback on thickness of the protective layer 330. The deposition process for the protective layer 330 may be ended when the protective layer 330 reaches a desired thickness, such as a thickness in a range of 1 nm to 500 nm. Real time feedback from one or more sensor(s) 170 (such as ellipsometer(s) or QCM(s); see above, FIG. 1B) may be used to monitor the deposition process and end it when the protective layer 330 reaches the desired thickness. For example, a QCM can monitor the thickness of the protective layer 330 as it is formed. After the deposition process for the protective layer 330 is complete, the test substrate 160 (if present) may be removed from the process chamber 200. In other embodiments, the thickness of the protective layer 330 is not monitored as it is formed.

Figure 6:
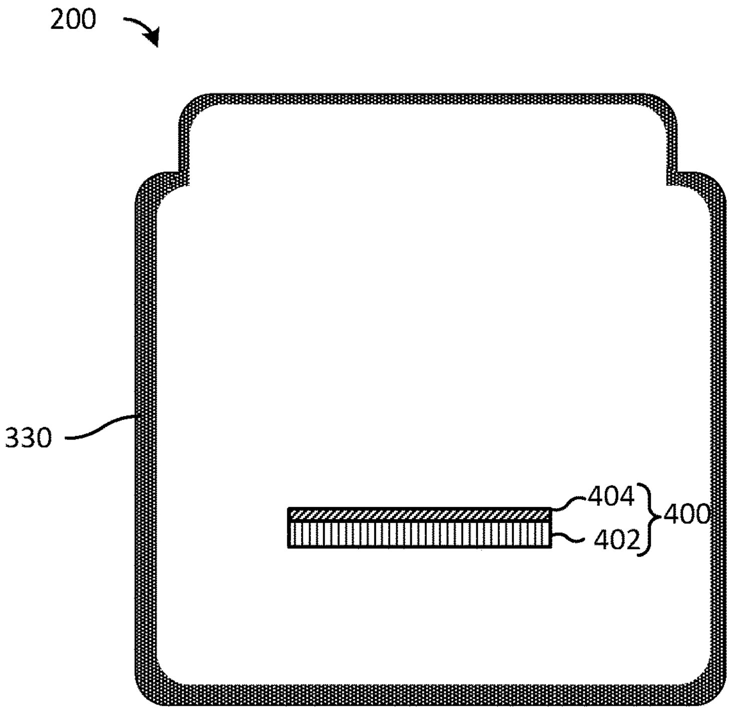
FIGS. 6 through 8 show an etch process performed in a process chamber with a protective layer, in accordance with some embodiments.
Figure 7:
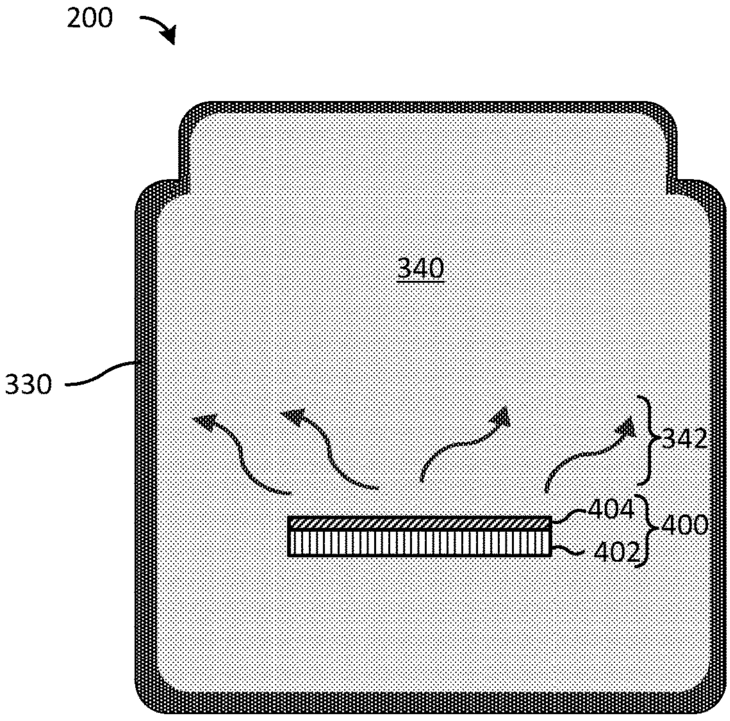
Figure 8:
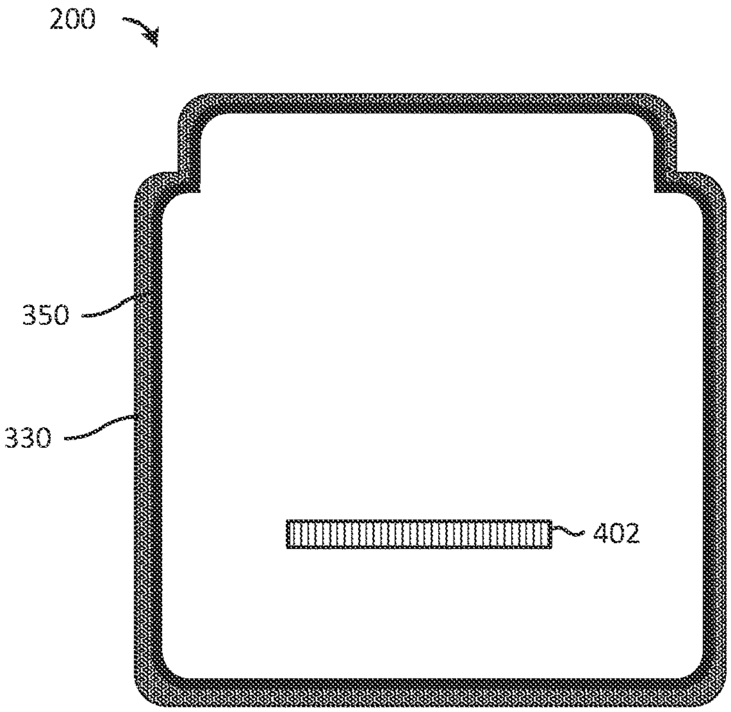

FIGS. 6 through 8 illustrate an example etch process performed in the process chamber 200 with the protective layer 330. In the example of FIGS. 6 through 8, the etch process is a dry development of a metal oxide resist. However, any suitable semiconductor process may be performed in the process chamber 200 with the protective layer 330, and all such semiconductor processes are within the scope of the disclosed embodiments.

In FIG. 6, a substrate 400 (also referred to as a process substrate or a process wafer) is loaded into the process chamber 200. The substrate 400 may be secured on a chuck (e.g., the chuck 140; see above, FIG. 1B). The substrate 400 may be a silicon wafer having a diameter in a range of 100 mm to 500 mm, such as a diameter of 150 mm, 200 mm, 300 mm, or 450 mm. In various embodiments, the substrate 400 may be a part of, or include, a semiconductor device, and may have undergone a number of steps of processing following, for example, a conventional process. The substrate 400 accordingly may comprise layers of semiconductors useful in various microelectronics. For example, the semiconductor structure may comprise the substrate 400 in which various device regions are formed.

In one or more embodiments, the substrate 400 may be a silicon wafer, or a silicon-on-insulator (SOI) wafer. In certain embodiments, the substrate 400 may comprise silicon germanium, silicon carbide, gallium arsenide, gallium nitride, or other compound semiconductors. In other embodiments, the substrate 400 comprises heterogeneous layers such as silicon germanium on silicon, gallium nitride on silicon, silicon carbon on silicon, as well layers of silicon on a silicon or SOI substrate. In various embodiments, the substrate 400 is patterned or embedded in other components of the semiconductor device. In some embodiments, the substrate 400 comprises conductive features (e.g., metal lines, not illustrated) embedded therein. The conductive features may be electrically coupled to active devices (not illustrated) further embedded in the substrate 400.

The substrate 400 in FIG. 6 includes a photoresist film 404 (e.g., a metal oxide resist) deposited over a lower portion 402 of the substrate 400 so that an exposed major surface of the substrate 400 comprises the photoresist film 404. In various embodiments, although not illustrated, the lower portion 402 of the substrate 400 may further comprise various layers useful for semiconductor device fabrication, which may be collectively regarded as a part of the substrate 400 in this disclosure. For example, in certain embodiments, over the lower portion of the substrate 400, there may be a dielectric layer comprising a silicon-based dielectric material with a low dielectric constant (i.e., low-k value) such as organosilicate glass (SiCOH), dense SiCOH, porous SiCOH, and other porous dielectric materials. Further, there may be a hard mask layer over the lower portion 402 of the substrate 400, which may be patterned in subsequent etch processes after the EUV photopatterning. In various embodiments, the hard mask may comprise titanium nitride, titanium, titanium oxide, tantalum, tungsten carbide, other tungsten based compounds, ruthenium based compounds, or aluminum based compounds. The hard mask may also be carbon-based or silicon-based mask materials.

In an example, the photoresist film 404 is formed over the lower portion 402 prior to loading the substrate 400 into the process chamber 200. In addition, the photoresist film 404 may be formed as a part of a tri-layer stack commonly used for photolithographic patterning. The tri-layer stack may be used to generate and transfer a pattern to the hard mask and then, for example, underlying layers such as the dielectric layer of the lower portion 402. In various embodiments, the multi-layer stack comprises an underlayer and the photoresist film 404 over the underlayer as an EUV-sensitive photoresist. In one or more embodiments, the underlayer comprises carbon materials (e.g., silicon carbide or silicon oxycarbide) and may be formed via a spin-on process or vapor deposition such as CVD. The multi-layer stack may further comprise layers of oxide (e.g., silicon oxide) or nitride (e.g., titanium nitride or silicon nitride) above the underlayer and the photoresist film 404. For simplicity of illustration, FIG. 6 illustrates only the photoresist film 404 directly deposited on the lower portion 402, but as described above, any suitable multi-layer structure may be present as a part of the lower portion 402 of the substrate 400 in various embodiments. In some embodiments, the photoresist film 404 has a thickness in a range of 10 nm to 300 nm, such as 150 nm.

In various embodiments, the photoresist film 404 comprises tin (Sn), antimony (Sb), hafnium (Hf), zirconium (Zr), zinc (Zn), the like, or a combination thereof. In certain embodiments, the photoresist film 404 comprises a metal oxide, a metal alkoxide, or a methacrylate (MAA) of Sn, Sb, Hf, Zr, Zn, or the like. In other embodiments, the photoresist film 404 is a photoresist that does not include metal oxide, e.g., a photopolymeric photoresist. However, the photoresist film 404 may comprise any suitable materials. The deposition of the photoresist film 404 may be performed by a dry or wet process. In various embodiments, the photoresist film 404 may be deposited by vapor deposition, for example chemical vapor deposition (CVD), plasma-enhanced CVD (PECVD), atomic layer deposition (ALD), or plasma-enhanced ALD (PEALD).

In certain embodiments, the deposition process for the photoresist film 404 may comprise exposing the substrate 400 to two precursors in a process chamber (e.g., a different chamber from the process chamber 200): a metal-containing precursor (e.g., a tin-containing precursor) and an oxygen-containing precursor. The exposures to these precursors may be performed stepwise or simultaneously. In various embodiments, the deposition process may be an ALD or pseudo-ALD process and comprise two or more exposing steps. For example, the deposition process may be performed by first exposing the substrate 400 to the tin-containing precursor that forms an adsorbed layer on the lower portion 402 of the substrate 400 and, thereafter, exposing the substrate 400 to the oxygen-containing precursor gas that reacts with the adsorbed tin-containing precursor. The exposing steps may be repeated one or more times to increase a thickness of the photoresist film 404 on the substrate 400. In certain embodiments, the exposing steps may be separated temporally or spatially. Temporally separating the exposing steps may be realized by changing the gas composition in a process chamber. On the other hand, spatially separating the exposing steps may be enabled by utilizing multiple spatially segregated sections within the process chamber and transporting the substrate from one section to another. For temporally separating the exposing steps even better, the vapor deposition may further include evacuating, purging, or both evacuating and purging, the process chamber between the exposing steps. These additional steps may be beneficial in ensuring the reaction occurs only on surface and not in the gas phase. The ALD or pseudo-ALD method in accordance with this embodiment may be particularly advantageous in enabling layer-by-layer growth of the photoresist film 404 with a high uniformity.

In another embodiment, instead of the ALD type process, the precursors may be supplied in the process chamber simultaneously to grow the photoresist film 404. Such an embodiment may be advantageous by allowing the continuous growth of the photoresist film 404 in a single step. In this embodiments, the reaction between the precursors may or may not occur in the gas phase as well as on surface.

In other embodiments, the photoresist film 404 may be deposited by liquid deposition using alternate exposures of a tin-containing precursor liquid and an oxygen-containing precursor liquid. The liquid deposition may further include rinsing the substrate with a rinsing solution to remove an excess amount and/or unreacted portion of the precursors between the exposing steps. The rinsing solution may comprise deionized water, common organic solvents such as acetone, propylene glyclol monomethyl ether acteate, 1-Methoxy-2-propanol, methyl isobutyl carbinol, hexane, tert-butanol and isopropanol, or mixtures thereof. In another embodiment, the liquid precursors may be mixed first and the mixture solution may be applied to the substrate to grow the photoresist film 404. In one or more embodiments, one of the precursors may be gaseous and another of the precursors may be liquid, and accordingly two different modes (vapor and liquid) of delivery may be utilized to perform the deposition process.

Next, the photoresist film 404 of the substrate 400 may be exposed to a light pattern, such as an EUV exposure. A photomask may be used to create an EUV light pattern by placing the photomask between the substrate 400 and an EUV light source (not illustrated). In response to the exposure to the EUV light pattern, a photoreaction may occur in exposed regions of the photoresist film 404, while unexposed regions remain unchanged. As a result of the photoreaction, the exposed regions may comprise a cross-linked photoresist film, which may have material properties substantially different from the unreacted portion of the photoresist film 404. Such a difference in the material properties includes volatility, reactivity, and/or solubility among others, which gives origin to the tonality as a photoresist. After exposure to the light pattern, the substrate 400 may be loaded into the process chamber 200 for an etch process (also referred to as a development process).

Next, in FIG. 7, an etch process (also referred to as a development process) is performed on the substrate 400 with a reactive precursor 340, which is flowed into the process chamber 200. In some embodiments, the etch process is a plasma-less process performed with a gaseous (non-ionized) reactive precursor 340 (also referred to as a developing gas). The reactive precursor 340 reacts with, e.g., the unexposed regions of the photoresist film 404 to produce volatile by-products 342, which then evaporate from the surface of the substrate 400. This reaction develops the photoresist film 404. In some embodiments, the reactive precursor 340 is a reactive gas such as hydrogen bromide (HBr), hydrogen chloride (HCl), boron trichloride ($BCl_3$), organic acids such carboxylic acids, methanol, ethanol, isopropyl alcohol, the like, or a mixture or combination thereof. In some embodiments, a carrier gas such as argon, neon, nitrogen, helium, xenon, the like, or a combination thereof is also flowed into the process chamber 200 with the reactive precursor 340.

In a particular embodiment, the reactive precursor 340 comprises HBr and the photoresist film 404 includes a metal oxide resist comprising tin (Sn). The volatile by-products 342 may contain tin, which may be deposited on exposed chamber walls of the protective layer 330, forming an etch by-product layer 350 (see below, FIG. 8). This may protect the chamber wall of the process chamber 200 from contamination by by-products (e.g., tin or other metals) of the etch process.

The etch process (also referred to as a developing step) may be performed using a flow rate of the reactive precursor 340 in a range of 1 sccm to 2000 sccm. The reactive precursor 340 may be performed at a temperature in the process chamber 200 in a range of −100° C. to 500° C. The reactive precursor 340 may be performed for a duration of 1 second to 1800 seconds.

FIG. 8 illustrates the substrate 400 and the process chamber 200 after the etch process shown in FIG. 7 has been performed. An etch by-product layer 350 has been deposited over the protective layer 330 on chamber walls of the process chamber 200. The presence of the protective layer 330 may reduce or prevent contamination of the chamber walls of the process chamber 200 by the etch by-product layer 350, which may comprise metals such as tin. The etch by-product layer 350 is illustrated as covering chamber walls of the protective layer 330 for simplicity of illustration, and it should be understood that the etch by-product layer 350 may be present as a continuous layer or as intermittent patches disposed across chamber walls of the protective layer 330.

After the completion of the etch process illustrated above in FIG. 7, the substrate 400 may be removed from the process chamber 200, such as for further processing. Although FIG. 8 illustrates the lower portion 402 of the substrate 400 remaining with the photoresist film 404 (see above, FIG. 7) completely removed, this is for simplicity of illustration. It should be understood that portions of the photoresist film 404 may remain on the lower portion 402 of the substrate 400 after the completion of the etch process illustrated above in FIG. 7. These remaining portions (not illustrated) of the photoresist film 404 may be used as an etching mask for subsequent processing of the substrate 400.

Figure 9:
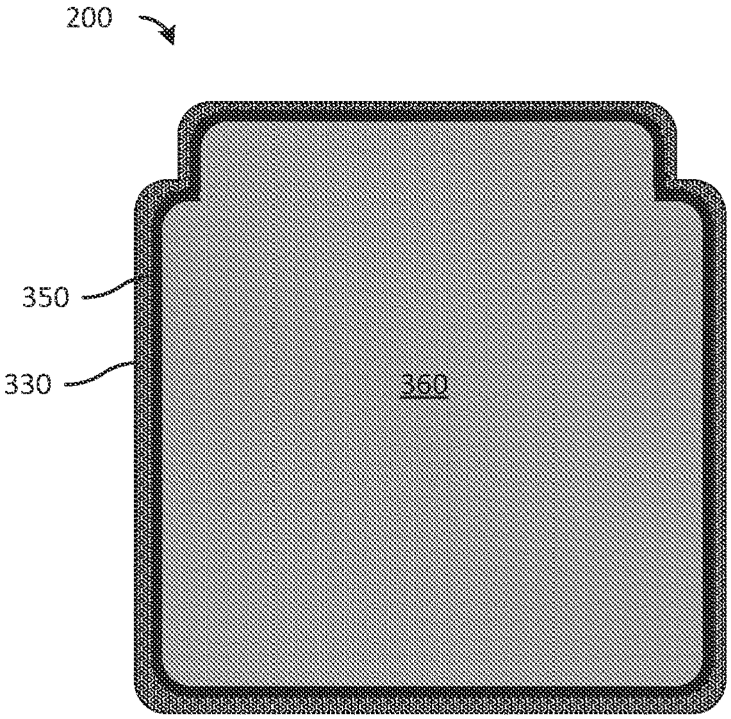
FIGS. 9 through 11 show a cleaning process to remove a protective layer from a process chamber, in accordance with some embodiments.
Figure 10:
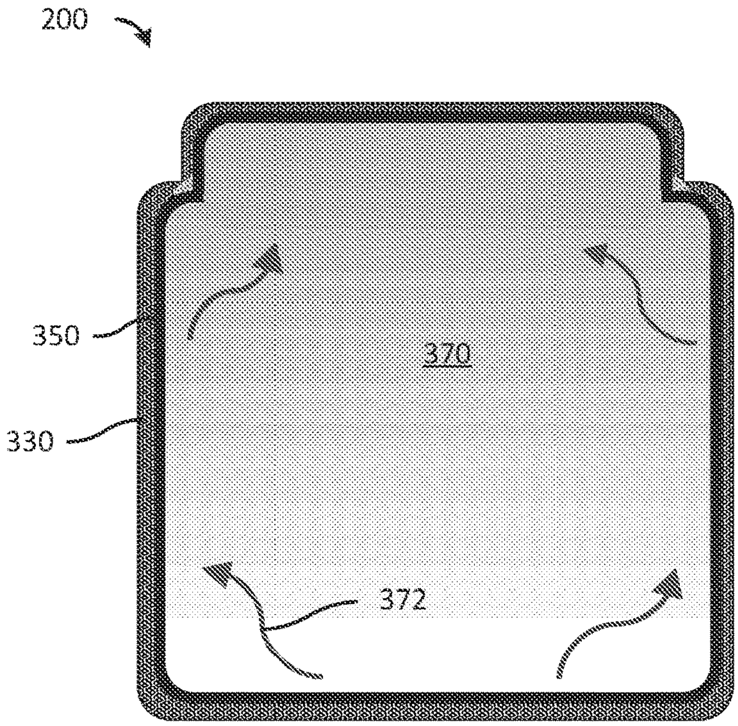
Figure 11:
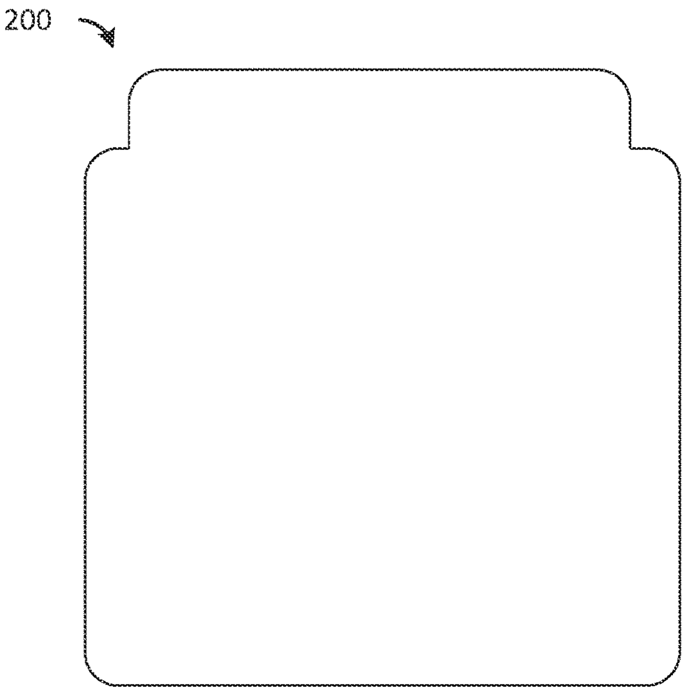

FIGS. 9 through 11 illustrate a cleaning process to remove the protective layer 330 and restore the process chamber 200 to its original condition. In FIG. 9, the process chamber 200 is filled with a cleaning precursor 360. In some embodiments, the cleaning precursor 360 comprises an oxidizing agent such as oxygen gas ($O_2$), ozone ($O_3$), the like, or a combination thereof. However, any suitable gases may be used for the cleaning precursor 360, such as chlorine ($Cl_2$) or the like. In some embodiments, the cleaning precursor 360 also comprises a noble gas such as argon, neon, helium, xenon, the like, or a combination thereof. However, any suitable gas(es) may be used for the cleaning precursor 360.

Next, in FIG. 10, a second plasma 370 is generated in the process chamber 200 by the excitation of the cleaning precursor 360. In some embodiments, the second plasma 370 comprises oxygen. The second plasma 370 cleans the chamber walls of the process chamber 200 by removing the protective layer 330 and the etch by-product layer 350. The protective layer 330 and the etch by-product layer 350 are removed by the second plasma 370 as second volatile by-products 372. The second plasma 370 may be lit (in other words, ignited) by similar methods as the first plasma 320 as described above with respect to FIG. 4, and the details are not repeated herein.

In some embodiments, the second plasma 370 comprises oxygen ($O_2$) and argon (Ar) at a volume ratio in a range of 1:99, such as 1:1. Oxygen-containing plasma may be advantageous for removing fluorocarbon films (e.g., the protective layer 330) as well as etch by-products of the etch by-product layer 350 (e.g., tin or the like). The second plasma 370 may be generated at a pressure in a range of 1 mT to 2000 mT, such as 50 mT, and the second plasma 370 may be generated using a power (as measured at the power supply) in a range of 1 W to 2000 W, such as 400 W. The second plasma 370 may be generated for a duration in a range of 0.5 minutes to 30 minutes, such as 2 minutes, to remove the protective layer 330 and the etch by-product layer 350. In some embodiments, the temperature of the process chamber 200 is held in a range of 20° C. to 200° C. during the cleaning process.

FIG. 11 illustrates the process chamber 200 in a clean condition after the cleaning process shown above in FIG. 10 has removed the protective layer 330 and the etch by-product layer 350. The process chamber 200 has been returned to close to its original condition as shown in FIG. 2 and is ready for another cycle of forming a protective layer, performing one or more etch processes, and removing the protective layer. The formation and removal of the protective layer may allow for the omitting of a lengthy cleaning with, for example, $Cl_2$ gas for 3 hours or more to remove contaminants such as tin from the chamber walls of the process chamber 200. Each etch step (e.g., an etch process on another wafer) does not necessarily need its own protective layer deposition and removal steps. The formation and removal frequency of the protective layer 330 can be tuned to obtain a balance between throughput and effectiveness of the protective layer 330. Once the protective layer 330 is formed, many wafers can be processed. The protective layer 330 may be removed before it is saturated with etch byproducts and becomes difficult to be removed effectively.

Figure 12:
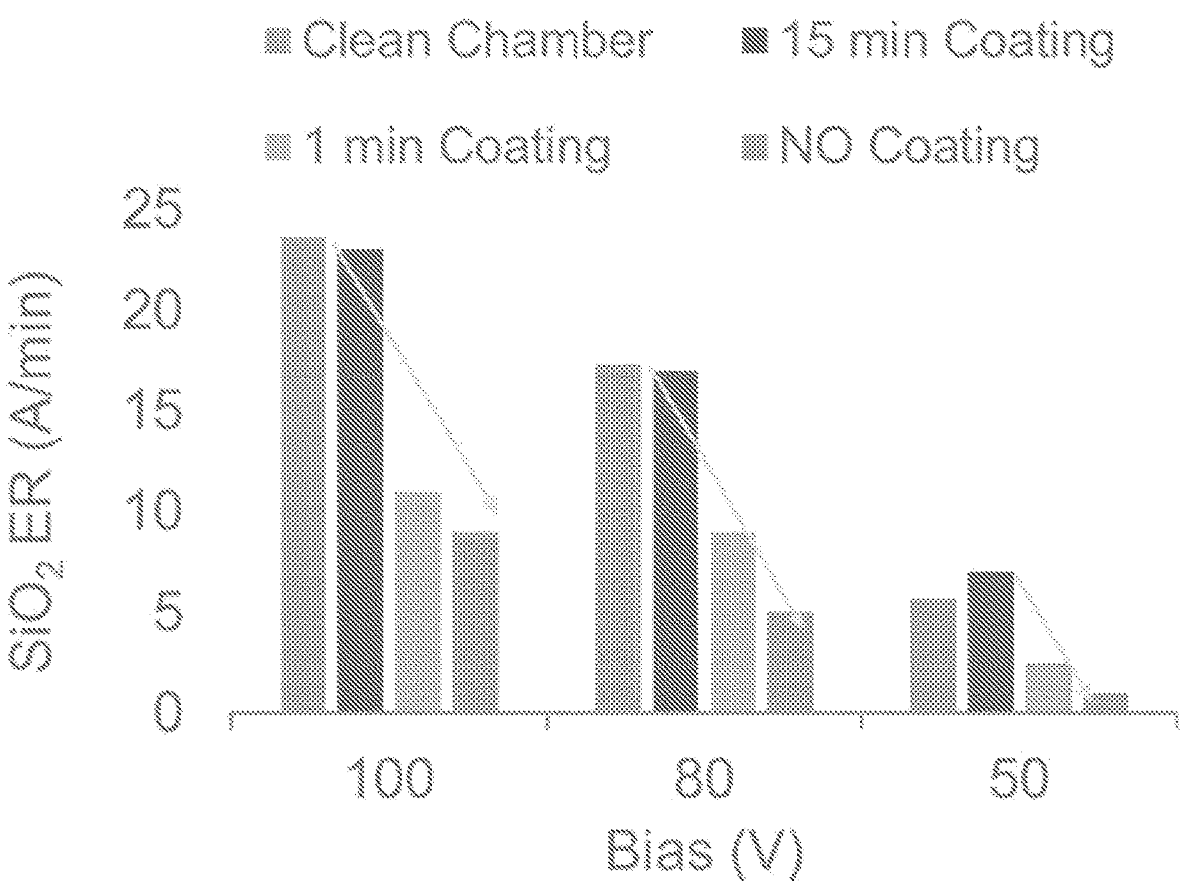
FIG. 12 is a graph showing experimental results from chamber health monitoring, in accordance with some embodiments.

FIG. 12 shows experimental results from chamber health monitoring to gauge the degrees of protection from contamination provided by a protective layer (e.g., the protective layer 330; see above, FIGS. 5-10). Chamber health is measured by using $SiO_2$ film physical sputtering by $Ar^+$ ions on a test substrate 160 (see above, FIG. 1B) for various chamber conditions. FIG. 12 is a graph of the $SiO_2$ etch rate (ER) in Å per minute (in other words, the rate that $SiO_2$ is sputtered from a film on the test substrate 160) for bias voltages applied to the chuck 140 (see above, FIG. 1B) of 50 V, 80 V, and 100 V. The chamber health was tested for four conditions: a clean chamber (in other words, a process chamber 200 in which no etch process involving dry development of a metal oxide resist had been performed; see above, FIG. 2), a chamber with no coating (in other words, a process chamber 200 in which an etch process involving dry development of a metal oxide resist had been performed without any protective layer), a chamber with a 1 minute coating (in other words, a process chamber 200 in which an etch process involving dry development of a metal oxide resist had been performed with a protective layer deposited for 1 minute), and a chamber with a 15 minute coating (in other words, a process chamber 200 in which an etch process involving dry development of a metal oxide resist had been performed with a protective layer deposited for 15 minutes). The 15 minute and 1 minute protective layers were removed after the metal oxide resist etch processes, and the respective $SiO_2$ film physical sputtering tests were performed after the removals of the respective protective layers.

As shown in FIG. 12, the $SiO_2$ etch rate was highest for the clean chamber and the chamber with a coating formed for 15 minutes. This may indicate that the protective layer (formed by 15 minutes of deposition) provided significant protection from contamination by etch by-products (e.g., tin), allowing the process chamber after a metal oxide resist etch process to retain similar performance as a clean process chamber in which a metal oxide resist etch process had not been performed.

However, the chamber with a coating formed for 1 minute had an $SiO_2$ etch rate only slightly higher than the chamber with no coating. This may indicate that the 1 minute coating did not provide significant protection from contamination by etch by-products (e.g., tin) in comparison to a chamber with no protective coating. The $SiO_2$ etch rate was significantly higher for the 15 minute coating case and the clean chamber than for the chamber with no coating or the 1 minute coating case. This may indicate that contamination of the chamber walls with etch by-products (e.g., tin) significantly reduced the $SiO_2$ etch rate and negatively affected the process chamber's performance. The relative differences in $SiO_2$ etch rates described above were observed for the 50 V bias case, the 80 V bias case, and the 100 V bias case, with the different bias voltages proportionately affecting the magnitudes of the $SiO_2$ etch rates.

Although the results of FIG. 12 appear to illustrate that a 1 minute deposition process may be insufficient to reduce or prevent contamination, it is possible that performance similar to the 15 minute deposition process may be achieved with different process conditions. For example, the temperature of the process chamber 200 (see above, FIG. 4) wall may be increased to control the deposition rate and achieve a thicker protective layer in a shorter deposition time, such as 1 minute.

Figure 13:
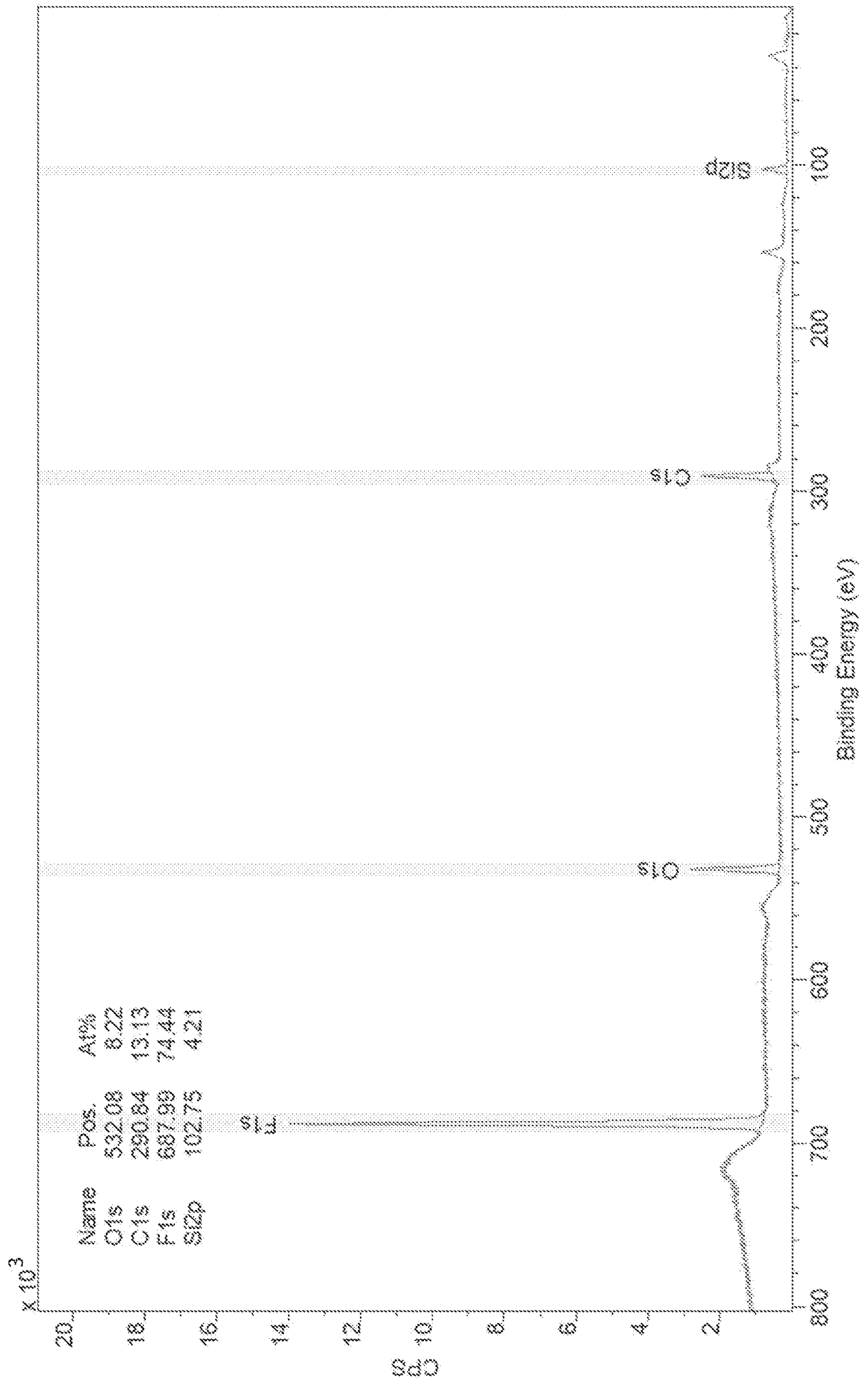
FIGS. 13 and 14 show experimental results for X-ray photoemission spectroscopy (XPS) of substrates with fluorocarbon layers, in accordance with some embodiments.
Figure 14:
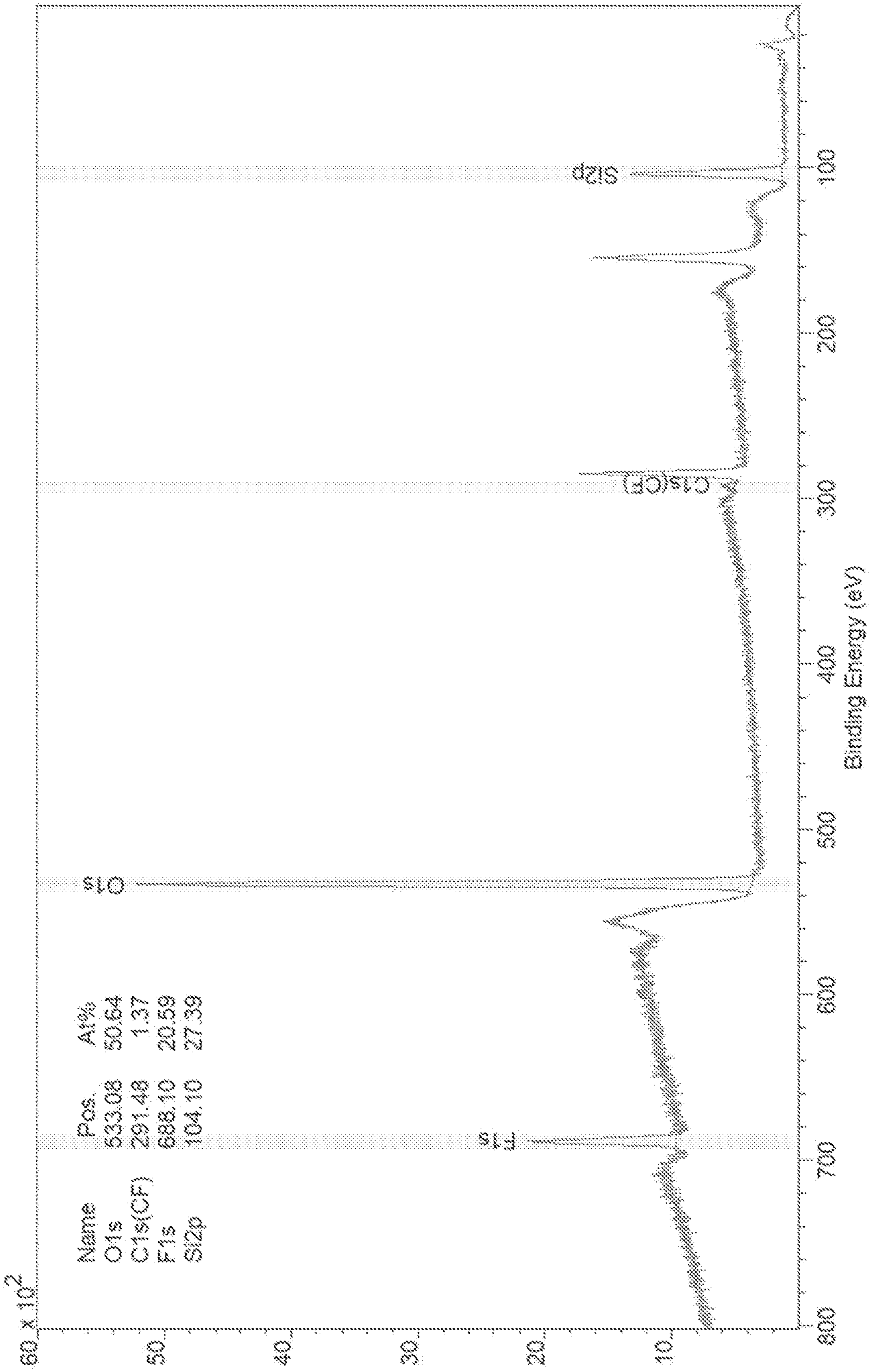

FIG. 13 shows experimental results for X-ray photoemission spectroscopy (XPS) of a fluorocarbon layer deposited for 15 minutes on a test substrate covered with a $SiO_2$ film, and FIG. 14 shows similar XPS results of a fluorocarbon layer (also referred to as a fluorocarbon film) deposited for 1 minute. The graphs of counts per second (CPS) versus binding energy (eV) shows peaks indicating the presence of carbon and fluorine of the fluorocarbon layer (in other words, that the deposited layer is fluorocarbon in nature), as well as the silicon and oxygen of the $SiO_2$ film. The magnitudes of the carbon and fluorine peaks are higher in FIG. 13 than in FIG. 14, while the magnitudes of the silicon and oxygen peaks are lower in FIG. 13 than in FIG. 14. This may indicate that the fluorocarbon film is formed to a greater thickness over the $SiO_2$ film in the 15 minute case of FIG. 13 than in the 1 minute case of FIG. 12, which increases the carbon and fluorine peaks while decreasing the oxygen and silicon peaks. The thicknesses of the fluorocarbon layer formed on the chamber walls of the process chambers may be proportional to the thicknesses of the fluorocarbon layer formed on the test substrates and measured by FIGS. 13 and 14.

Figure 15:
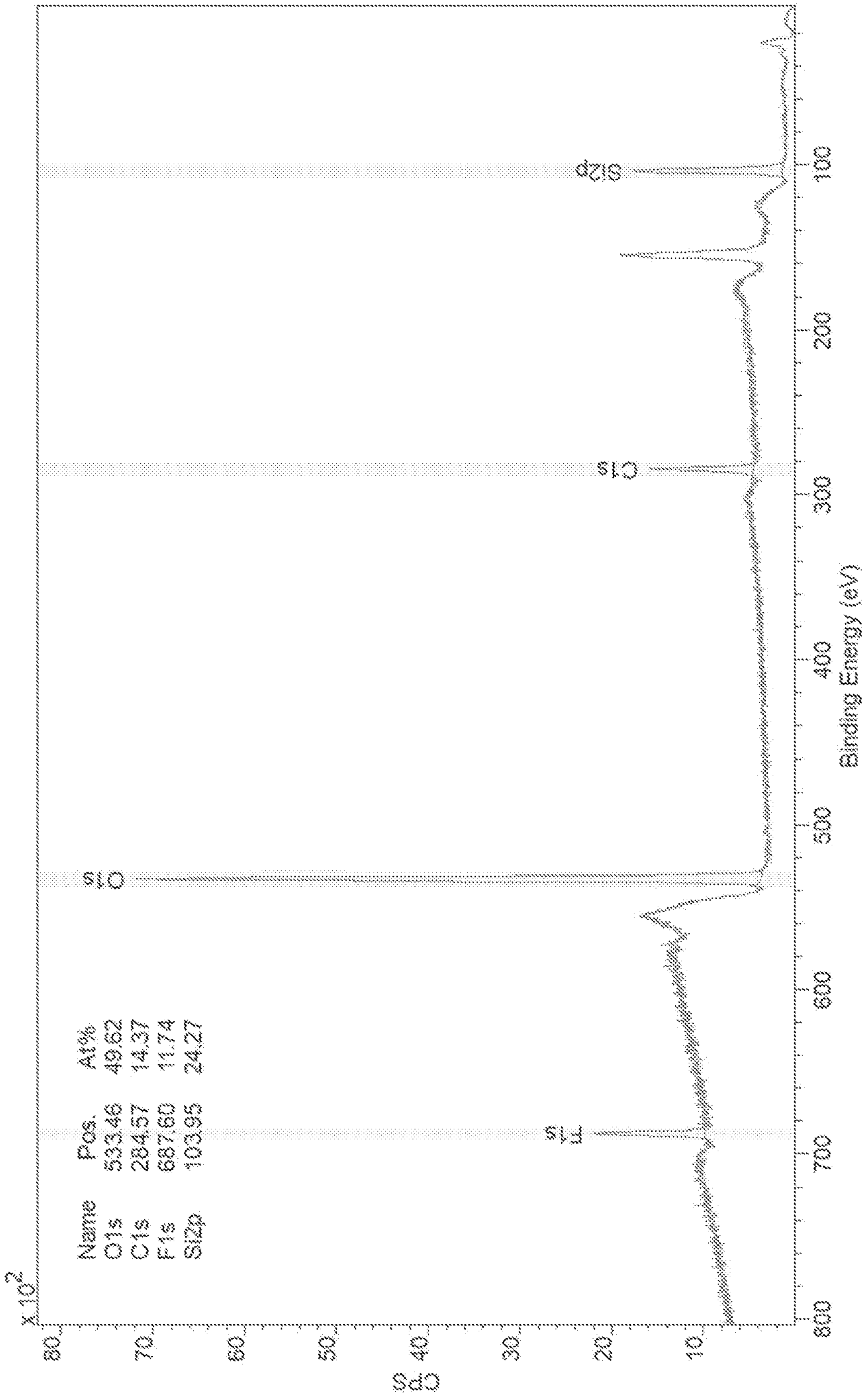
FIGS. 15 and 16 show experimental results for X-ray photoemission spectroscopy (XPS) of substrates after protective layers are removed, in accordance with some embodiments.
Figure 16:
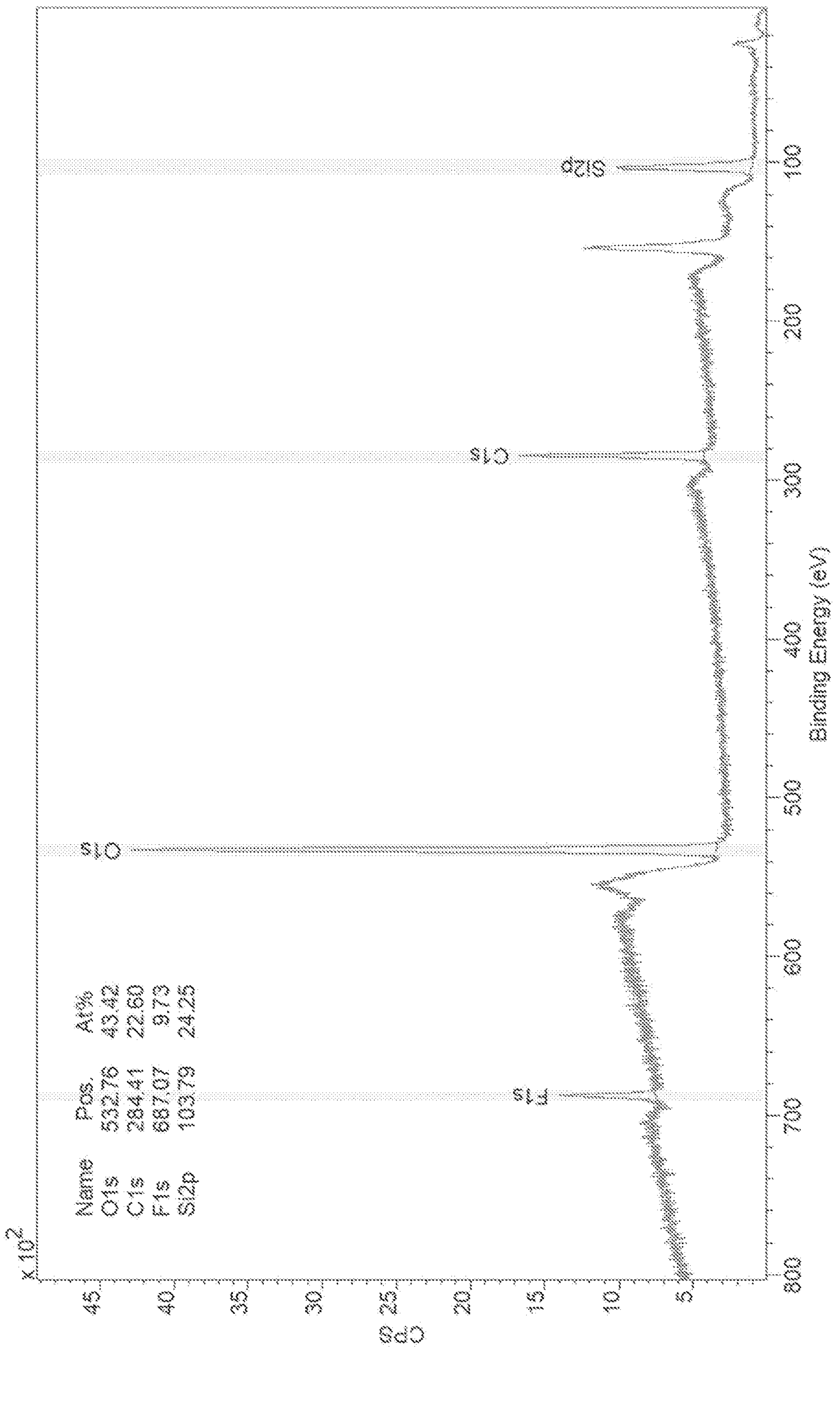

FIGS. 15 and 16 show experimental results for XPS of respective test substrates after the fluorocarbon layers of the test substrates have been removed (e.g., by the cleaning process described above with respect to FIGS. 9-10) for the cases of fluorocarbon layers formed by a 15 minute deposition and a 1 minute deposition, respectively. An etch process of a substrate with a metal oxide resist may also have been performed in the respective process chambers before the removal of the fluorocarbon layers.

Both FIGS. 15 and 16 illustrate much smaller fluorine and carbon peaks than in FIGS. 13 and 14, respectively. This may indicate that most of the CF polymers (in other words, the fluorocarbon film) was removed from the test substrates (and also the chamber walls of the process chambers) by the cleaning process. Additionally, the XPS results do not indicate the presence of tin (Sn) residue, which suggests that most or all of the impurities from the etching of the metal oxide resist were effectively removed during the cleaning process.

Figure 17:
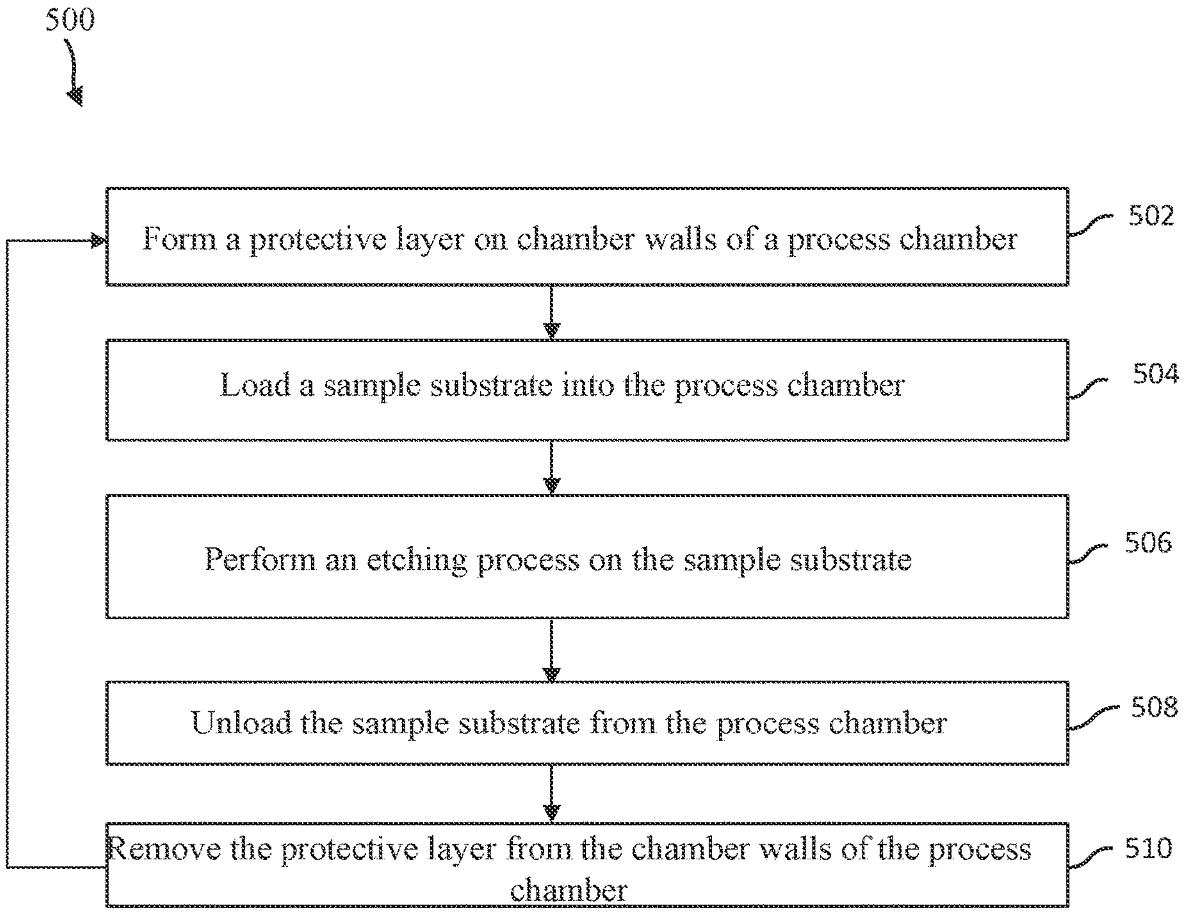
FIGS. 17 through 21 illustrate process flow chart diagrams of methods for performing etch processes, in accordance with some embodiments.

FIG. 17 illustrates a process flow chart diagram of a method 500 for performing an etch process while protecting a process chamber from contamination, in accordance with some embodiments. In step 502, a protective layer 330 is formed on chamber walls of a process chamber 200, as described above with respect to FIGS. 3-5. In step 504, a sample substrate (e.g., the substrate 400) is loaded into the process chamber 200, as described above with respect to FIG. 6.

In step 506, an etching process is performed on the sample substrate, as described above with respect to FIG. 7. In step 508, the sample substrate is removed from the process chamber 200, as described above with respect to FIG. 8. In step 510, the protective layer 330 is removed from the chamber walls of the process chamber, as described above with respect to FIGS. 9-10. Next, the method may return to step 502 for any suitable number of cycles.

Figure 18:
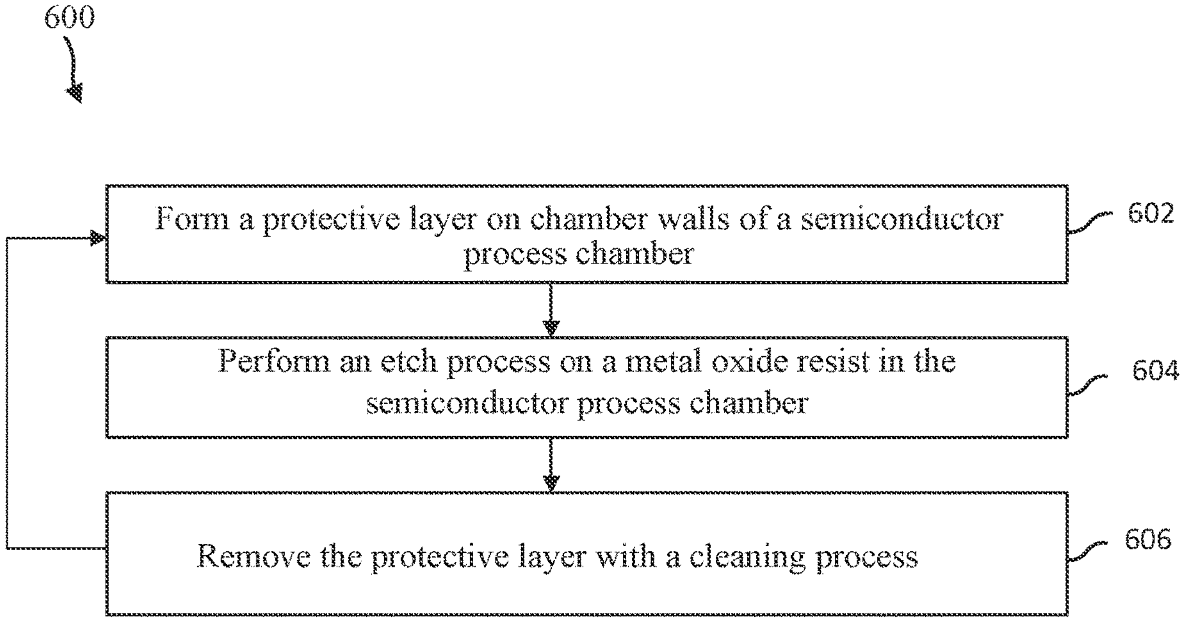

FIG. 18 illustrates a process flow chart diagram of another method 600 for performing an etch process, in accordance with some embodiments. In step 602, a first protective layer (e.g., the protective layer 330) is formed over chamber walls of a semiconductor process chamber (e.g., the process chamber 200), as described above with respect to FIGS. 3-5.

In step 604, a first etch process is performed on an exposed major surface of a first substrate (e.g., a substrate 400) loaded into the semiconductor process chamber where an exposed major surface of the first substrate comprises a first metal oxide resist layer (e.g., the photoresist film 404), as described above with respect to FIG. 7. The first protective layer protects the chamber walls of the semiconductor process chamber from contamination by residues from the first etch process. In step 606, after performing the first etch process on the first substrate, the first protective layer is removed from the chamber walls of the semiconductor process chamber with a cleaning process, as described above with respect to FIGS. 9-10. Next, the method may return to step 602 for any suitable number of cycles.

Figure 19:
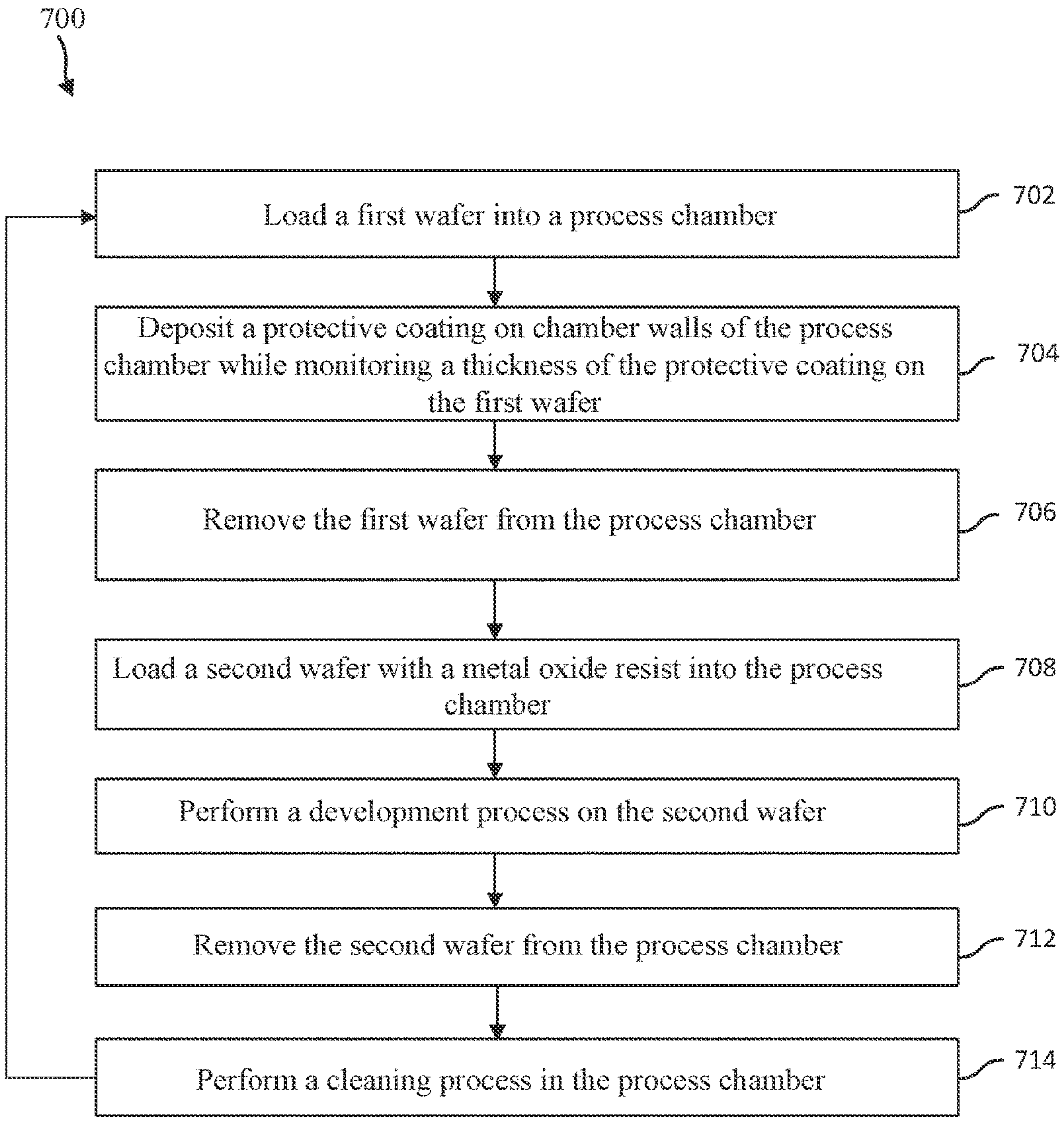

FIG. 19 illustrates a process flow chart diagram of another method 700 for performing an etch process, in accordance with some embodiments. In step 702, a first wafer (e.g., the test substrate 160) is loaded into a process chamber 200, as described above with respect to FIG. 2. In step 704, a protective coating (e.g., the protective layer 330) is deposited on chamber walls of the process chamber 200 and on the first wafer while monitoring a thickness of the protective coating on the first wafer, as described above with respect to FIGS. 3-5.

In step 706, the first wafer is removed from the process chamber 200, as described above with respect to FIG. 5. In step 708, a second wafer (e.g., the substrate 400) is loaded into the process chamber 200 with a metal oxide resist (e.g., the photoresist film 404) being on the second wafer, as described above with respect to FIG. 6. In step 710, a development process is performed on the second wafer, as described above with respect to FIG. 7.

In step 712, the second wafer is removed from the process chamber 200, as described above with respect to FIG. 8. In step 714, a cleaning process is performed in the process chamber 200 to remove the protective coating, as described above with respect to FIGS. 9-10. Next, the method may return to step 702 for any suitable number of cycles.

Figure 20:
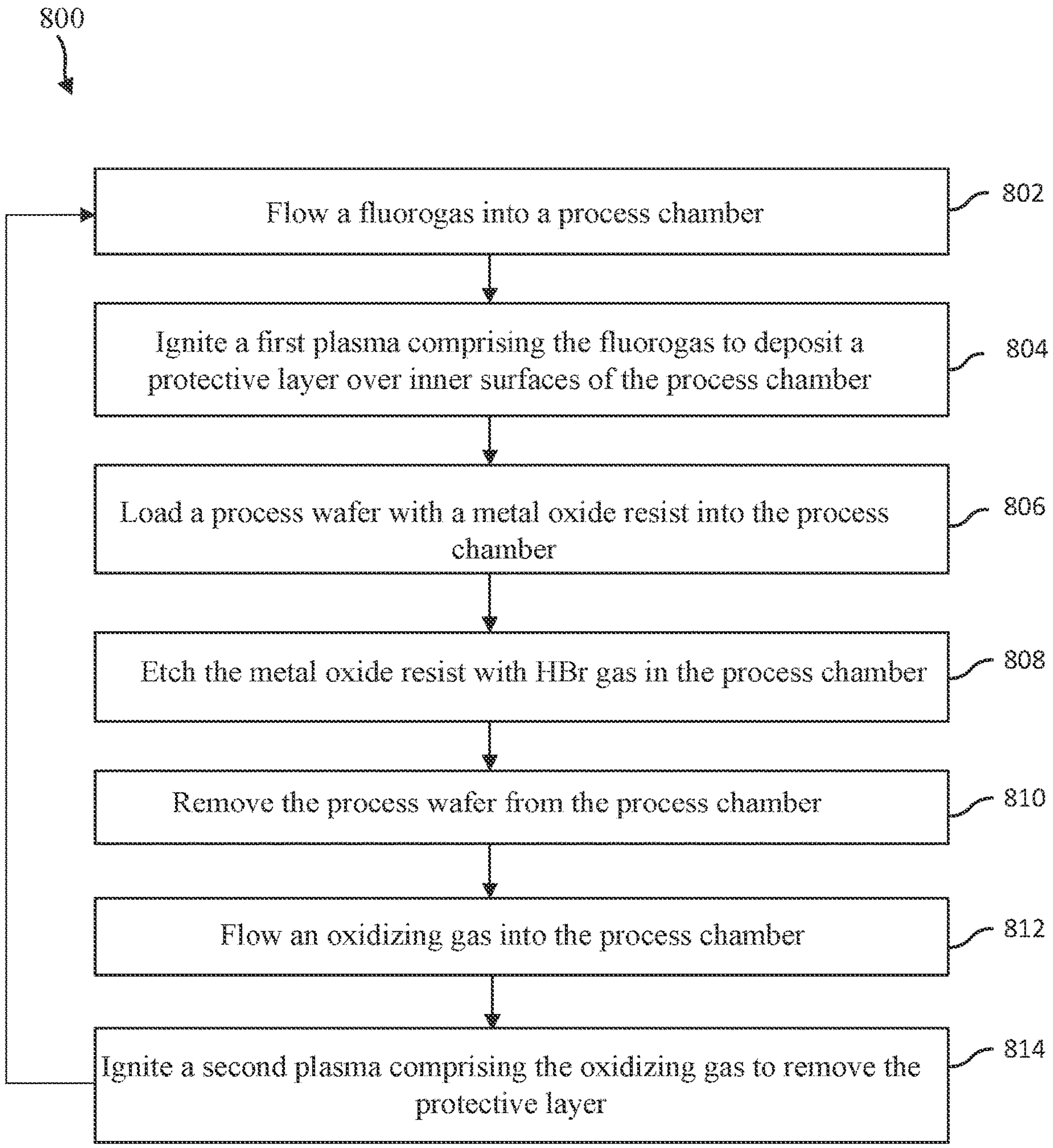

FIG. 20 illustrates a process flow chart diagram of another method 800 for performing an etch process, in accordance with some embodiments. In step 802, a fluorogas (e.g., the precursor 310) is flowed into a process chamber 200, as described above with respect to FIG. 3. In step 804, a first plasma 320 comprising the fluorogas is ignited and the first plasma 320 deposits a protective layer 330 over inner surfaces of the process chamber 200, as described above with respect to FIGS. 4-5.

In step 806, a process wafer (e.g., the substrate 400) with a metal oxide resist (e.g., the photoresist film 404) is loaded into the process chamber 200, as described above with respect to FIG. 6. In step 808, the metal oxide resist is etched with HBr gas (e.g., the reactive precursor 340) in the process chamber 200, so that residues (e.g., volatile by-products 342) from the etching of the metal oxide resist are deposited on the protective layer 330, as described above with respect to FIG. 7.

In step 810, the process wafer is removed from the process chamber 200, as described above with respect to FIG. 8. In step 812, an oxidizing gas (e.g., the cleaning precursor 360) is flowed into the process chamber 200, as described above with respect to FIG. 9. In step 814, a second plasma 370 comprising the oxidizing gas is ignited and the second plasma 370 removes the protective layer 330, as described above with respect to FIG. 10. Next, the method may return to step 802 for any suitable number of cycles.

Figure 21:
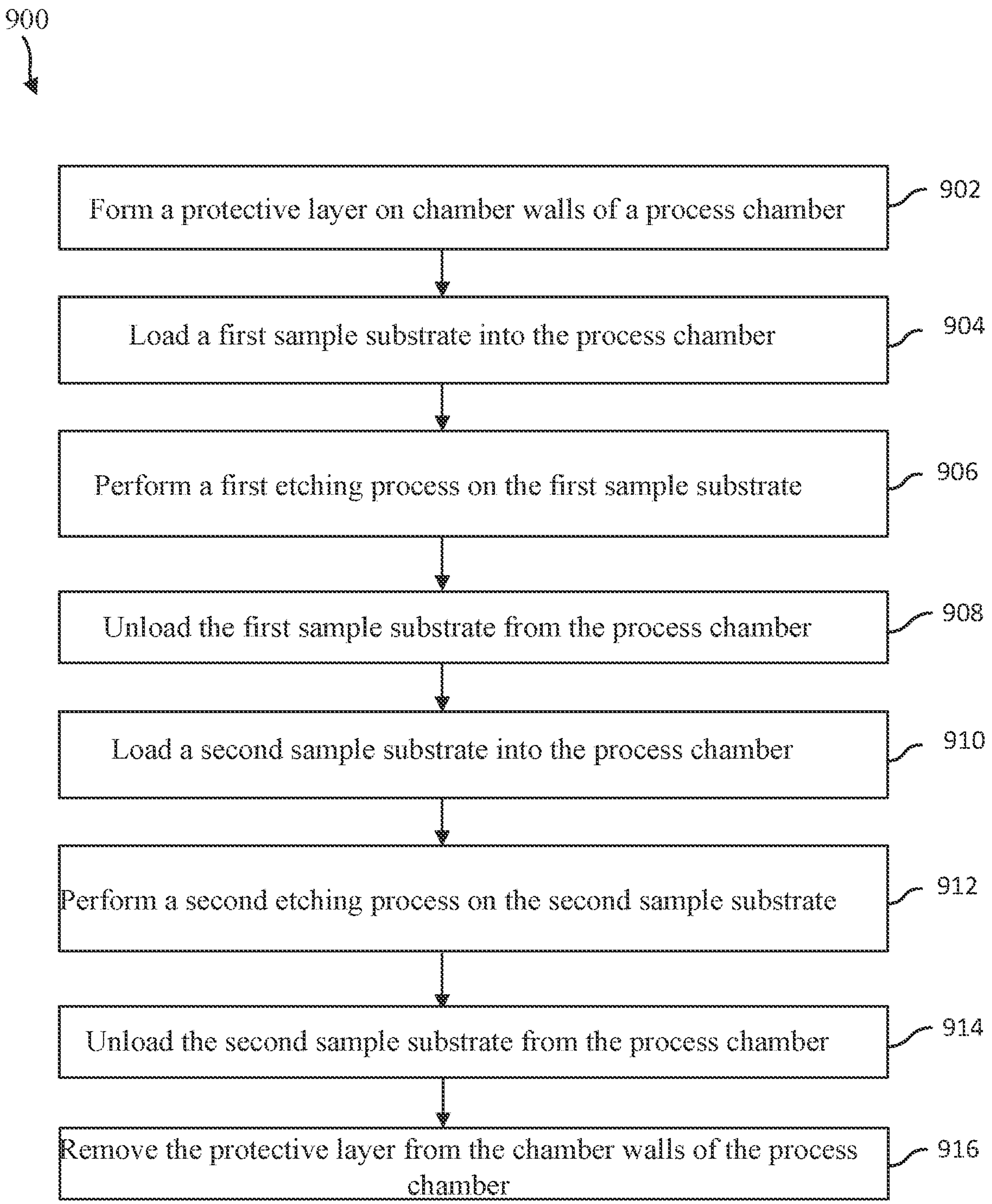

FIG. 21 illustrates a process flow chart diagram of a method 900 for performing multiple etch processes while protecting a process chamber from contamination, in accordance with some embodiments. In step 902, a protective layer 330 is formed on chamber walls of a process chamber 200, as described above with respect to FIGS. 3-5.

In step 904, a first sample substrate (e.g., the substrate 400) is loaded into the process chamber 200, as described above with respect to FIG. 6. In step 906, a first etching process is performed on the first sample substrate, as described above with respect to FIG. 7. In step 908, the first sample substrate is removed from the process chamber 200, as described above with respect to FIG. 8.

In step 910, a second sample substrate (e.g., the substrate 400) is loaded into the process chamber 200, as described above with respect to FIG. 6. In step 912, a second etching process is performed on the second sample substrate, as described above with respect to FIG. 7. In step 914, the second sample substrate is removed from the process chamber 200, as described above with respect to FIG. 8.

In step 916, the protective layer 330 is removed from the chamber walls of the process chamber, as described above with respect to FIGS. 9-10. Although FIG. 21 illustrates two etch processes performed on two sample substrates, any suitable number of etch processes on any suitable number of sample substrates may be performed before removing the protective layer 330. Next, the method may return to step 902 for any suitable number of cycles, each cycle including any suitable number of etch processes.

Example embodiments of the disclosure are summarized here. Other embodiments can also be understood from the entirety of the specification as well as the claims filed herein.

Example 1. A method for performing an etch process, the method including: forming a first protective layer over chamber walls of a semiconductor process chamber; performing a first etch process on an exposed major surface of a first substrate loaded into the semiconductor process chamber, the exposed major surface including a first metal oxide resist layer; and after performing the first etch process on the first substrate, removing the first protective layer from the chamber walls with a cleaning process.

Example 2. The method of example 1, where the first protective layer includes carbon and fluorine.

Example 3. The method of one of examples 1 or 2, where the cleaning process includes an oxygen plasma.

Example 4. The method of one of examples 1 to 3, where the first metal oxide resist layer includes tin.

Example 5. The method of one of examples 1 to 4, further including performing a second etch process on an exposed major surface of a second substrate loaded into the semiconductor process chamber before removing the first protective layer from the chamber walls.

Example 6. The method of one of examples 1 to 4, further including while forming the first protective layer, monitoring a thickness of the first protective layer with a quartz crystal microbalance.

Example 7. The method of one of examples 1 to 4 or 6, further including: forming a second protective layer over the chamber walls of the semiconductor process chamber after removing the first protective layer; and performing a second etch process on a second substrate loaded in the semiconductor process chamber, the second substrate including an exposed major surface including a second metal oxide resist layer.

Example 8. A method for performing an etch process, the method including: loading a first wafer into a process chamber; depositing a protective coating on chamber walls of the process chamber and on the first wafer while monitoring a thickness of the protective coating on the first wafer; removing the first wafer from the process chamber; loading a second wafer into the process chamber, a metal oxide resist being on the second wafer; performing a development process on the second wafer; removing the second wafer from the process chamber; and performing a cleaning process in the process chamber, the cleaning process removing the protective coating.

Example 9. The method of example 8, where monitoring the thickness of the protective coating on the first wafer includes measuring the thickness in real time with an ellipsometer.

Example 10. The method of example 9, further including using feedback from the ellipsometer to stop the depositing the protective coating when the protective coating has reached a desired thickness.

Example 11. The method of one of examples 8 to 10, where depositing the protective coating includes forming a plasma in the process chamber, the plasma including carbon, fluorine, and argon.

Example 12. The method of one of examples 8 to 11, where the development process is a plasma-less process.

Example 13. The method of example 12, where the plasma-less process includes HBr.

Example 14. The method of one of examples 8 to 13, where the cleaning process includes forming a plasma in the process chamber, the plasma including oxygen and argon.

Example 15. A method for performing an etch process, the method including: flowing a fluorogas into a process chamber; igniting a first plasma including the fluorogas, the first plasma depositing a protective layer over inner surfaces of the process chamber; loading a process wafer with a metal oxide resist into the process chamber; etching the metal oxide resist with HBr gas in the process chamber, where residues from the etching of the metal oxide resist are deposited on the protective layer; removing the process wafer from the process chamber; flowing an oxidizing gas into the process chamber; and igniting a second plasma including the oxidizing gas, the second plasma removing the protective layer.

Example 16. The method of example 15, where the fluorogas is $C_4F_8$.

Example 17. The method of example 16, where the first plasma is formed with $C_4F_8$ and argon in a volume ratio of 15:40.

Example 18. The method of one of examples 15 to 17, where the second plasma is formed with oxygen and argon in a volume ratio of 1:1.

Example 19. The method of one of examples 15 to 18, where etching the metal oxide resist with HBr gas is a plasma-less process.

Example 20. The method of one of examples 15 to 19, further including: loading a test substrate into the process chamber before flowing the fluorogas into the process chamber; and removing the test substrate from the process chamber after depositing the protective layer.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method for performing an etch process, the method comprising:

loading a first wafer into a process chamber;

depositing a protective coating on chamber walls of the process chamber and on the first wafer while monitoring a thickness of the protective coating being formed on the first wafer;

removing the first wafer from the process chamber;

loading a second wafer into the process chamber, a metal oxide resist being on the second wafer;

performing a development process on the second wafer;

removing the second wafer from the process chamber; and performing a cleaning process in the process chamber, the cleaning process removing the protective coating.

2. The method of claim 1, wherein monitoring the thickness of the protective coating on the first wafer comprises measuring the thickness in real time with an ellipsometer.

3. The method of claim 2, further comprising using feedback from the ellipsometer to stop depositing the protective coating when the protective coating has reached a desired thickness.

4. The method of claim 1, wherein depositing the protective coating comprises forming a plasma in the process chamber, the plasma comprising carbon, fluorine, and argon.

5. The method of claim 1, wherein the development process is a plasma-less process.

6. The method of claim 5, wherein the plasma-less process comprises HBr.

7. The method of claim 1, wherein the cleaning process comprises forming a plasma in the process chamber, the plasma comprising oxygen and argon.

8. A method for performing an etch process, the method comprising:

flowing fluorogas into a process chamber;

igniting a first plasma comprising the fluorogas, the first plasma depositing a protective layer over inner surfaces of the process chamber;

monitoring a thickness of the protective layer in real time with an ellipsometer while the first plasma deposits the protective layer;

loading a process wafer with a metal oxide resist into the process chamber;

etching the metal oxide resist with HBr gas in the process chamber, wherein residues from the etching of the metal oxide resist are deposited on the protective layer;

removing the process wafer from the process chamber;

flowing an oxidizing gas into the process chamber; and igniting a second plasma comprising the oxidizing gas, the second plasma removing the protective layer.

9. The method of claim 8, wherein the fluorogas is $C_4F_8$.

10. The method of claim 9, wherein the first plasma is formed with $C_4F_8$ and argon in a volume ratio of 15:40.

11. The method of claim 8, wherein the second plasma is formed with oxygen and argon in a volume ratio of 1:1.

12. The method of claim 8, wherein etching the metal oxide resist with HBr gas is a plasma-less process.

13. The method of claim 8, further comprising:

loading a test substrate into the process chamber before flowing the fluorogas into the process chamber; and removing the test substrate from the process chamber after depositing the protective layer.

14. A method for performing an etch process, the method comprising:

forming a protective layer on chamber walls of a process chamber;

monitoring a thickness of the protective layer while forming the protective layer;

loading a first sample substrate into the process chamber;

performing a first etching process on the first sample substrate;

unloading the first sample substrate from the process chamber;

loading a second sample substrate into the process chamber;

performing a second etching process on the second sample substrate;

unloading the second sample substrate from the process chamber; and removing the protective layer from the chamber walls of the process chamber.

15. The method of claim 14, wherein the protective layer comprises carbon and fluorine.

16. The method of claim 14, wherein removing the protective layer from the chamber walls of the process chamber is performed with an oxygen plasma.

17. The method of claim 14, wherein respective exposed major surfaces of the first sample substrate and the second sample substrate comprise respective metal oxide resist layers.

18. The method of claim 17, wherein the respective metal oxide resist layers comprise tin.

19. The method of claim 14, wherein monitoring the thickness of the protective layer comprises measuring the thickness in real time with an ellipsometer.

* * * * *